(12) United States Patent
Long et al.

(10) Patent No.: US 12,154,500 B2
(45) Date of Patent: Nov. 26, 2024

(54) DISPLAY PANEL INCLUDING DATA LINE OF THREE PORTIONS AND DISPLAY DEVICE INCLUDING THE DISPLAY PANEL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yue Long, Beijing (CN); Yao Huang, Beijing (CN); Lili Du, Beijing (CN); Weiyun Huang, Beijing (CN); Yuanjie Xu, Beijing (CN); Binyan Wang, Beijing (CN); Yudiao Cheng, Beijing (CN)

(73) Assignees: Beijing BOE Technology Development Co., Ltd., Beijing (CN); Chengdu BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 17/788,426

(22) PCT Filed: Apr. 30, 2021

(86) PCT No.: PCT/CN2021/091345
§ 371 (c)(1),
(2) Date: Jun. 23, 2022

(87) PCT Pub. No.: WO2022/226967
PCT Pub. Date: Nov. 3, 2022

(65) Prior Publication Data
US 2024/0169912 A1   May 23, 2024

(51) Int. Cl.
*G09G 3/3233*   (2016.01)
*H10K 59/131*   (2023.01)
(Continued)

(52) U.S. Cl.
CPC ......... *G09G 3/3233* (2013.01); *H10K 59/131* (2023.02); *H10K 59/353* (2023.02);
(Continued)

(58) Field of Classification Search
CPC ......... G09G 3/3233; G09G 2320/0233; G09G 2360/142; H10K 59/353; H10K 59/131; H10K 59/65
See application file for complete search history.

(56) References Cited

U.S. PATENT DOCUMENTS

2009/0051636 A1   2/2009   Natori
2016/0189611 A1   6/2016   Jinta
(Continued)

FOREIGN PATENT DOCUMENTS

CN   107221281 A   9/2017
CN   107993581 A   5/2018
(Continued)

OTHER PUBLICATIONS

Extended European Search report dated Dec. 19, 2023 received in European Patent Application No. EP 21938443.5.
(Continued)

*Primary Examiner* — Stephen G Sherman
(74) *Attorney, Agent, or Firm* — Scully, Scott, Murphy & Presser, P.C.

(57) ABSTRACT

A display panel and a display device are provided. The display panel includes: a pixel unit including a pixel circuit and a light-emitting element, the pixel circuit including a driving transistor and a data writing transistor; and a data line connected to the data writing transistor; the data line includes a plurality of first-type data lines and a plurality of second-type data lines, each of the plurality of second-type data lines includes a first portion, a second portion, and a third portion, and the first portion and the second portion are
(Continued)

connected by the third portion, the third portion and the second portion are located in different layers, the third portion and the first portion are located in different layers, the first portion is closer to the base substrate than the third portion, and the second portion is closer to the base substrate than the third portion.

20 Claims, 33 Drawing Sheets

(51) Int. Cl.
  *H10K 59/35* (2023.01)
  *H10K 59/65* (2023.01)
(52) U.S. Cl.
  CPC ..... *H10K 59/65* (2023.02); *G09G 2320/0233* (2013.01); *G09G 2360/142* (2013.01)

(56) References Cited

U.S. PATENT DOCUMENTS

2017/0288003 A1    10/2017    Kim et al.
2021/0110765 A1    4/2021     Sung et al.
2022/0069047 A1    3/2022     Yang et al.
2022/0199735 A1*   6/2022     Wang .................. G09G 3/3233

FOREIGN PATENT DOCUMENTS

| CN | 108447887 A  | 8/2018  |
| CN | 111161643 A  | 5/2020  |
| CN | 111682048 A  | 9/2020  |
| CN | 111710239 A  | 9/2020  |
| CN | 111834413 A  | 10/2020 |
| CN | 111916486 A  | 11/2020 |
| CN | 112185302 A  | 1/2021  |
| WO | 2020259473 A1| 12/2020 |

OTHER PUBLICATIONS

Notice of First Review Opinion dated Jun. 26, 2024 received in Chinese Patent Application No. 202110693170.2.

* cited by examiner

DISPLAY PANEL INCLUDING DATA LINE OF THREE PORTIONS AND DISPLAY DEVICE INCLUDING THE DISPLAY PANEL

CROSS-REFERENCE TO RELATED APPLICATIONS

This application is a U.S. National Phase Entry of PCT International Application No. PCT/CN2021/091345, filed on Apr. 30, 2021. The disclosure of PCT International Application No. PCT/CN2021/091345 is incorporated by reference herein in its entirety.

TECHNICAL FIELD

At least one embodiment of the present disclosure relates to a display panel and a display device.

BACKGROUND

With the continuous development of display technology, active-matrix organic light-emitting diode (AMOLED) display technology has been more and more used in mobile phones, tablet computers, digital cameras and other display devices due to its advantages such as self-luminescence, wide viewing angle, high contrast, low power consumption, and high response speed, and the like.

An under-screen camera technology is a brand-new technology proposed to increase the screen-to-body ratio of a display device.

SUMMARY

At least one embodiment of the present disclosure provides a display panel and a display device.

At least one embodiment of the present disclosure provides a display panel, including: a base substrate; a pixel unit located on the base substrate and including a pixel circuit and a light-emitting element, the pixel circuit being configured to drive the light-emitting element, the pixel circuit including a driving transistor and a data writing transistor, and the driving transistor being connected to the data writing transistor; and a data line connected to the data writing transistor; the data line includes a plurality of first-type data lines and a plurality of second-type data lines, the plurality of first-type data lines are arranged in a first direction, each of the plurality of first-type data lines extends in a second direction, and the first direction intersects with the second direction, each of the plurality of second-type data lines includes a first portion, a second portion, and a third portion, and the first portion and the second portion are connected by the third portion, the first portion and the second portion both extend in the second direction, and the third portion extends in the first direction, the third portion and the second portion are located in different layers, the third portion and the first portion are located in different layers, the first portion is closer to the base substrate than the third portion, and the second portion is closer to the base substrate than the third portion.

For example, in some embodiments of the present disclosure, a size of the third portion in the first direction is greater than or equal to a distance between the first portion and the second portion in the first direction.

For example, in some embodiments of the present disclosure, the display panel further includes a plurality of dummy lines, the plurality of dummy lines and the third portion of the second-type data line are located in the same layer.

For example, in some embodiments of the present disclosure, a plurality of third portions are provided, and the plurality of dummy lines and the plurality of third portions are uniformly arranged in the display panel.

For example, in some embodiments of the present disclosure, an extension direction of each of the plurality of dummy lines is the same as an extension direction of the third portion.

For example, in some embodiments of the present disclosure, each of the plurality of dummy lines is connected to a constant voltage line.

For example, in some embodiments of the present disclosure, the constant voltage line includes at least one selected from the group consisting of a first power supply line, a second power supply line, and an initialization signal line.

For example, in some embodiments of the present disclosure, the display panel further includes a plurality of dummy data lines, the plurality of dummy data lines, the first portion of the second-type data line, and the second portion of the second-type data line are all located in the same layer.

For example, in some embodiments of the present disclosure, the display panel further includes a first initialization signal line and a second initialization signal line, the pixel circuit further includes a first reset transistor and a second reset transistor, the first reset transistor is connected to a gate electrode of the driving transistor and is configured to reset the gate electrode of the driving transistor, and the second reset transistor is connected to a first electrode of the light-emitting element and is configured to reset the first electrode of the light-emitting element, the first initialization signal line is connected to the gate electrode of the driving transistor through the first reset transistor, and the second initialization signal line is connected to the first electrode of the light-emitting element through the second reset transistor, and the first initialization signal line and the second initialization signal line are not connected to be configured to apply signals, respectively.

For example, in some embodiments of the present disclosure, the third portion is located between pixel circuits of two adjacent pixel units in the second direction.

For example, in some embodiments of the present disclosure, a plurality of third portions are provided, and the plurality of third portions are arranged in the display panel in a dispersed manner.

For example, in some embodiments of the present disclosure, a distance between two adjacent third portions in the second direction is greater than or equal to a sum of sizes of two pixel units in the second direction.

For example, in some embodiments of the present disclosure, a plurality of third portions are uniformly arranged within at least half of the size of the display panel in the second direction.

For example, in some embodiments of the present disclosure, the base substrate has a first display region and a second display region, the first display region is located on at least one side of the second display region, and the pixel unit includes a first pixel unit and a second pixel unit, the pixel circuit and the light-emitting element of the first pixel unit are located in the first display region, the pixel circuit of the second pixel unit is located in the first display region, the light-emitting element of the second pixel unit is located in the second display region, the pixel circuit of the second pixel unit is connected to the light-emitting element of the second pixel unit through a conductive line, and an orthographic projection of the third portion on the base substrate does not overlap with an orthographic projection of the conductive line on the base substrate.

For example, in some embodiments of the present disclosure, the orthographic projection of the conductive line on the base substrate partially overlaps with an orthographic projection of the pixel circuit of the first pixel unit on the base substrate.

At least one embodiment of the present disclosure further provides a display device, including any one of the display panels described above.

For example, in some embodiments of the present disclosure, the display device further includes a photosensitive sensor, and the photosensitive sensor is located on one side of the display panel.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not construed any limitation to the present disclosure.

DETAILED DESCRIPTION

Figure 1:
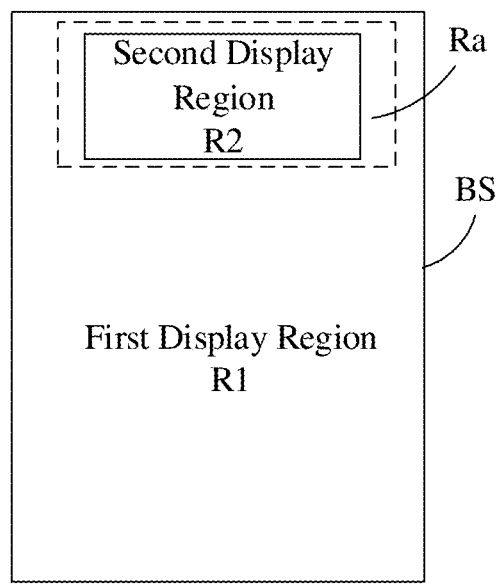
FIG. 1 is a schematic structural diagram of a display panel provided by an embodiment of the present disclosure.

In order to make objectives, technical details, and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

With the development of display technology, the existing notch screen or water drop screen design gradually cannot meet user's demand for a high screen-to-body ratio of a display panel, and a series of display panels with light-transmitting display regions have emerged as the times require. In this type of display panel, hardware such as a photosensitive sensor (for example, a camera) can be disposed in the light-transmitting display region. Because there is no need to punch holes, it is possible to realize a true full screen on the premise of ensuring the practicability of the display panel.

In a related art, a display panel with an under-screen camera generally includes a first display region for normal display and a second display region for disposing a camera. The second display region generally includes a plurality of light-emitting elements and a plurality of pixel circuits. Each pixel circuit is connected to a light-emitting element and used to drive the light-emitting element to emit light, and the pixel circuit and the light-emitting element connected to each other overlap with each other in a direction perpendicular to the display panel.

Because pixel circuits are also disposed in the second display region in the related art, the light transmittance of the second display region is poor, and accordingly, the display effect of the display panel is poor.

FIG. 1 is a schematic structural diagram of a display panel provided by an embodiment of the present disclosure. As illustrated in FIG. 1, the display panel includes a base substrate BS. The display panel includes a first display region R1 and a second display region R2, and the first display region R1 may be located on at least one side of the second display region R2. For example, in some embodiments, the first display region R1 surrounds the second display region R2. That is, the second display region R2 may be surrounded by the first display region RE The second display region R2 can also be arranged at other positions, and the arrangement position of the second display region R2 can be determined according to needs. For example, the second display region R2 may be located at the top middle position of the base substrate BS, or may be located at the upper left position or the upper right position of the base substrate BS. For example, hardware such as a photosensitive sensor (for example, a camera) is disposed in the second display region R2 of the display panel. For example, the second display region R2 is a light-transmitting display region, and the first display region R1 is a display region. For example, the first display region R1 is opaque and only used for display.

Figure 2:
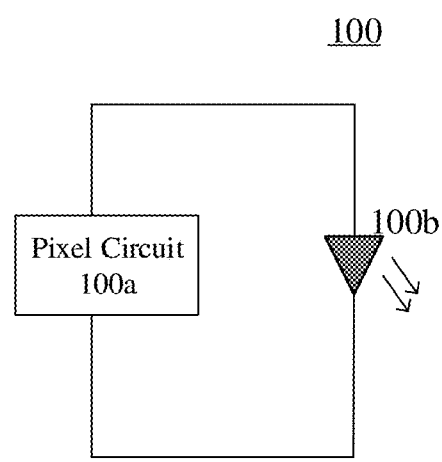
FIG. 2 is a schematic diagram of a pixel unit of a display panel provided by an embodiment of the present disclosure.

FIG. 2 is a schematic diagram of a pixel unit of a display panel provided by an embodiment of the present disclosure. The display panel includes a pixel unit 100, and the pixel unit 100 is located on a base substrate. As illustrated in FIG. 2, the pixel unit 100 includes a pixel circuit 100*a* and a light-emitting element 100*b*, and the pixel circuit 100*a* is configured to drive the light-emitting element 100*b*. For example, the pixel circuit 100*a* is configured to provide a driving current to drive the light-emitting element 100*b* to emit light. For example, the light-emitting element 100*b* is an organic light-emitting diode (OLED), and the light-emitting element 100*b* emits red light, green light, blue light, or white light under the driving of its corresponding pixel circuit 100*b*. The light-emitting color of the light-emitting element 100*b* can be determined according to needs.

In order to increase the light transmittance of the second display region R2, only light-emitting elements may be disposed in the second display region R2, and pixel circuits for driving the light-emitting elements of the second display region R2 may be disposed in the first display region RE That is, the light transmittance of the second display region R2 is improved by the way that the light-emitting elements and the pixel circuits are separately disposed.

Figure 3:
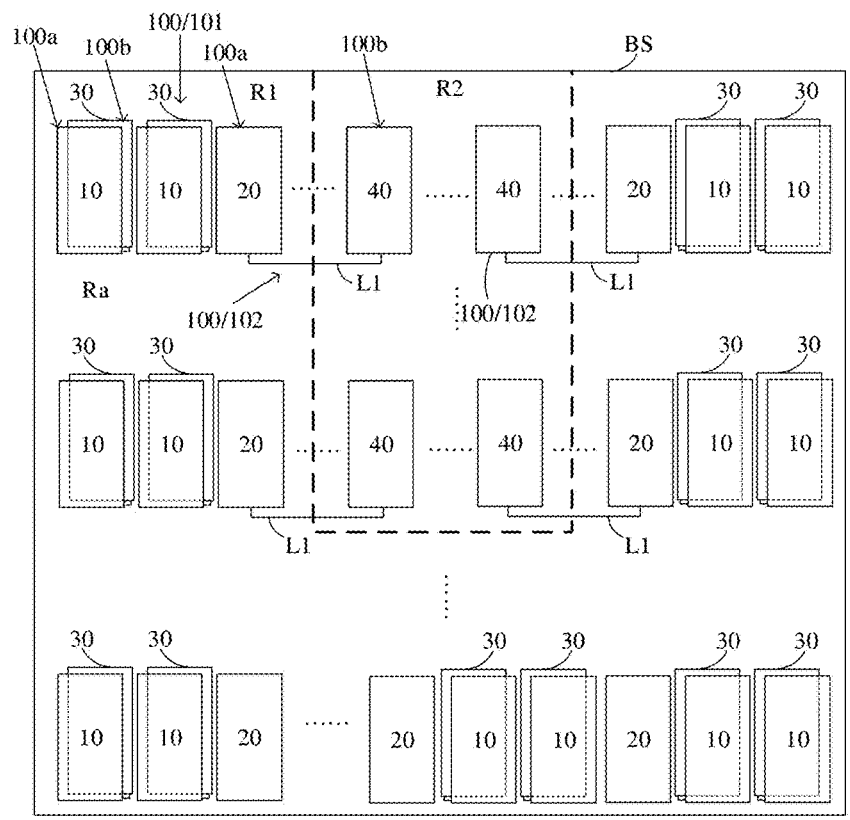
FIG. 3 is a schematic diagram of a display panel provided by an embodiment of the present disclosure.

FIG. 3 is a schematic diagram of a display panel provided by an embodiment of the present disclosure. As illustrated in FIG. 3, the display panel includes a plurality of first pixel circuits 10, a plurality of second pixel circuits 20, and a plurality of first light-emitting elements 30 located in a first display region R1, and a plurality of second light-emitting elements 40 located in a second display region R2. For example, the plurality of second pixel circuits 20 may be distributed among the plurality of first pixel circuits 10 at intervals.

For example, as illustrated in FIG. 3, at least one first pixel circuit 10 of the plurality of first pixel circuits 10 is connected to at least one first light-emitting element 30 of the plurality of first light-emitting elements 30, and an orthographic projection of the at least one first pixel circuit 10 on the base substrate BS at least partially overlaps with an orthographic projection of the at least one first light-emitting element 30 on the base substrate BS. The at least one first pixel circuit 10 can be used to provide a driving signal for the connected first light-emitting element 30 to drive the first light-emitting element 30 to emit light.

For example, as illustrated in FIG. 3, at least one second pixel circuit 20 of the plurality of second pixel circuits 20 is connected to at least one second light-emitting element 40 of the plurality of second light-emitting elements 40 through a conductive line L1, and the at least one second pixel circuit 20 can be used to provide a driving signal for the connected second light-emitting element 40 to drive the second light-emitting element 40 to emit light. As illustrated in FIG. 3, because the second light-emitting element 40 and the second pixel circuit 20 are located in different regions, there is no overlap between an orthographic projection of the at least one second pixel circuit 20 on the base substrate BS and an orthographic projection of the at least one second light-emitting element 40 on the base substrate BS.

For example, in the embodiments of the present disclosure, the first display region R1 can be set as an opaque display region, and the second display region R2 can be set as a light-transmitting display region. For example, the first display region R1 cannot transmit light, and the second display region R2 can transmit light. In this way, the display panel provided by the embodiment of the present disclosure does not need to perform drilling processing on the display panel, and the required hardware structure such as the photosensitive sensor can be directly arranged at a position corresponding to the second display region R2 on one side of the display panel, which lays a solid foundation for the realization of a true full screen. In addition, because the second display region R2 only includes light-emitting elements and does not include pixel circuits, it is beneficial to increase the light transmittance of the second display region R2, so that the display panel has a better display effect.

As illustrated in FIG. 3, the pixel unit 100 includes a first pixel unit 101 and a second pixel unit 102. A pixel circuit 100*a* and a light-emitting element 100*b* of the first pixel unit 101 are both located in the first display region R1, a pixel circuit 100*a* of the second pixel unit 102 is located in the first display region R1, and a light-emitting element 100*b* of the second pixel unit 102 is located in the second display region R2. In the embodiments of the present disclosure, the pixel circuit 100*a* of the first pixel unit 101 is the first pixel circuit 10, the light-emitting element 100*b* of the first pixel unit 101 is the first light-emitting element 30, the pixel circuit 100*a* of the second pixel unit 101 is the second pixel circuit 20, and the light-emitting element 100*b* of the second pixel unit 102 is the second light-emitting element 40. For example, the first light-emitting element 30 may be referred to as an in-situ light-emitting element. For example, the first pixel circuit 10 may be referred to as an in-situ pixel circuit, and the second pixel circuit 20 may be referred to as an ex-situ pixel circuit.

For example, as illustrated in FIG. 3, the second light-emitting element 40 and the second pixel circuit 20 connected to the second light-emitting element 40 are located in the same row. That is, the light-emitting signal of the second light-emitting element 40 comes from the second pixel circuit in the same row. For example, pixel circuits of pixel units in the same row are connected to the same gate line.

As illustrated in FIG. 3, the pixel circuit (the second pixel circuit 20) of the second pixel unit 102 is connected to the light-emitting element (the second light-emitting element 40) of the second pixel unit 102 through the conductive line L1. For example, the conductive line L1 is made of a transparent conductive material. For example, the conductive line L1 is made of conductive oxide material. For example, the conductive oxide material includes indium tin oxide (ITO), but is not limited thereto.

As illustrated in FIG. 3, one end of the conductive line L1 is connected to the second pixel circuit 20, and the other end of the conductive line L1 is connected to the second light-emitting element 40. As illustrated in FIG. 3, the conductive line L1 extends from the first display region R1 to the second display region R2.

As illustrated in FIG. 1 and FIG. 3, in some embodiments, the display panel further includes an auxiliary region Ra, and the auxiliary region Ra can be provided with the second pixel circuit 20.

Figure 4:
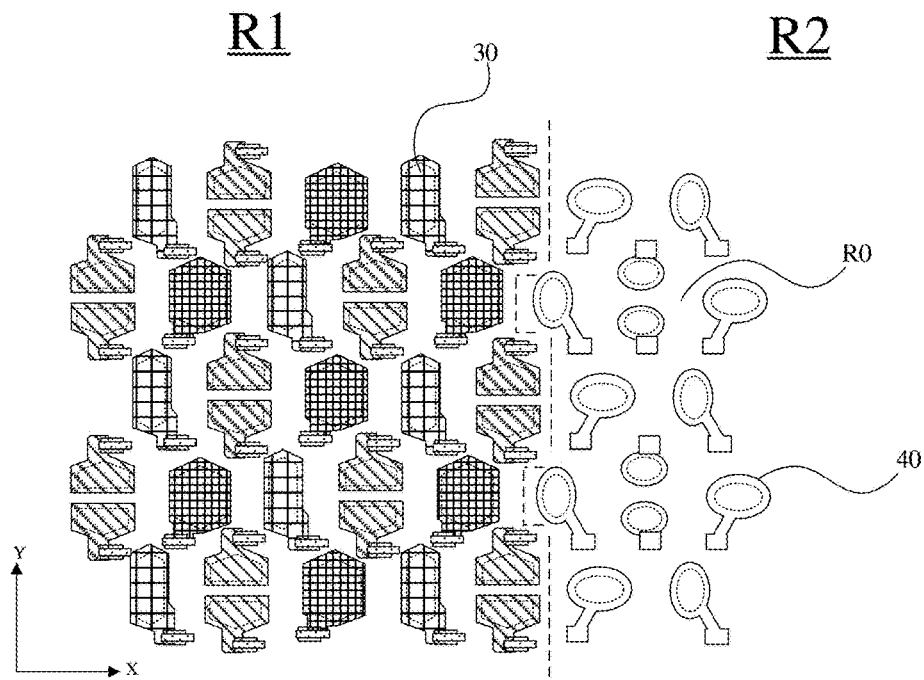
FIG. 4 is a schematic diagram of a first display region and a second display region in a display panel provided by an embodiment of the present disclosure.

FIG. 4 is a schematic diagram of the first display region and the second display region in the display panel provided by an embodiment of the present disclosure. As illustrated in FIG. 4, in the second display region R2, a light-transmitting region R0 is disposed between adjacent second light-emitting elements 40. For example, as illustrated in FIG. 4, a plurality of light-transmitting regions R0 are connected to each other to form a continuous light-transmitting region separated by a plurality of second light-emitting elements 40. The conductive wire L1 is made of a transparent conductive material to increase the light transmittance of the light-transmitting region R0 as much as possible. As illustrated in FIG. 4, the region of the second display region R2 except for the second light-emitting element 40 may be a light-transmitting region.

FIG. 5A to FIG. 5E are partial plan views of a display panel provided by an embodiment of the present disclosure. FIG. 5A to FIG. 5E are described below.

Figure 5A:
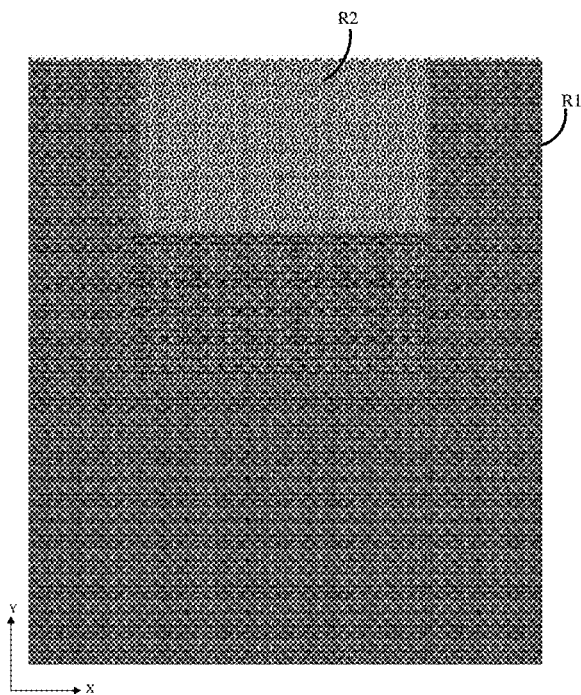
FIG. 5A to FIG. 5E are partial plan views of a display panel provided by an embodiment of the present disclosure.

FIG. 5A is a schematic diagram of a first display region and a second display region of a display panel provided by an embodiment of the present disclosure. As illustrated in FIG. 5A, the second display region R2 is a light-transmitting display region, and the first display region R1 is a display region.

Figure 5B:
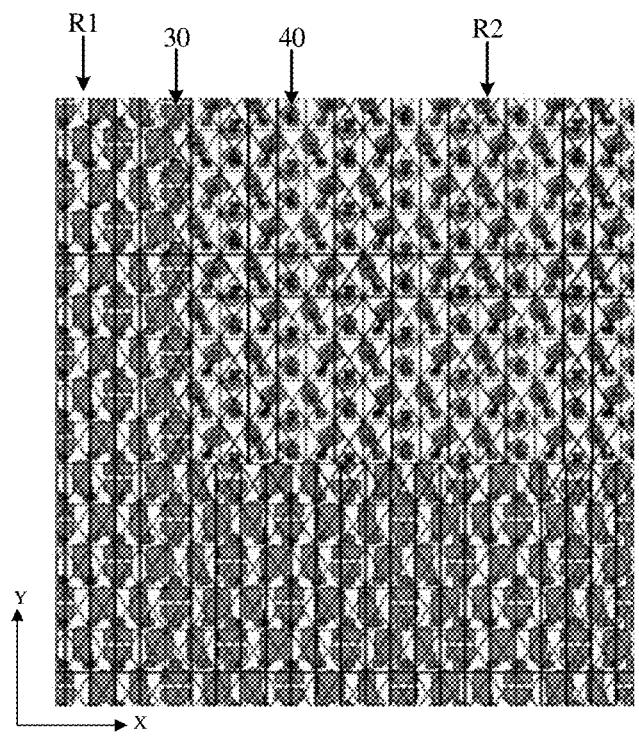

FIG. 5B is a schematic diagram of a first light-emitting element in a first display region and a second light-emitting element in a second display region of a display panel provided by an embodiment of the present disclosure. FIG. 5B illustrates the first light-emitting element 30 and the second light-emitting element 40.

Referring to FIG. 5A, FIG. 5B, and FIG. 3, in order to improve the display effect, the density of the second light-emitting element 40 may be equal to the density of the first light-emitting element 30. That is, the resolution of the second display region R2 is the same as the resolution of the first display region RE Of course, in other embodiments, the density of the second light-emitting element 40 may be greater or less than the density of the first light-emitting element 30. That is, the resolution of the second display region R2 may be greater or less than the resolution of the first display region RE For example, as illustrated in FIG. 5B and FIG. 4, the light-emitting area of the second light-emitting element 40 is smaller than the light-emitting area of the first light-emitting element 30. FIG. 4 illustrates the light-emitting area of the second light-emitting element 40 and the light-emitting area of the first light-emitting element 30 with broken lines. For example, the light-emitting area of a light-emitting element may correspond to the area of the opening of a pixel definition layer.

Figure 5C:
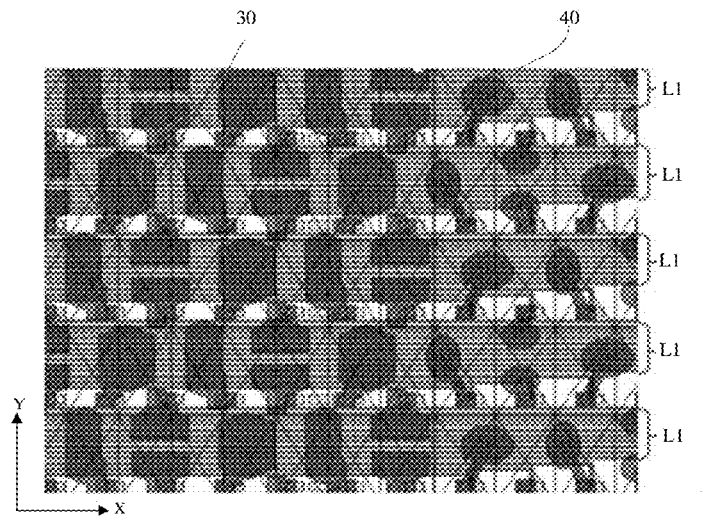

FIG. 5C is a schematic diagram of conductive lines in a display panel provided by an embodiment of the present disclosure. FIG. 5C illustrates a plurality of conductive lines L1.

Figure 5D:
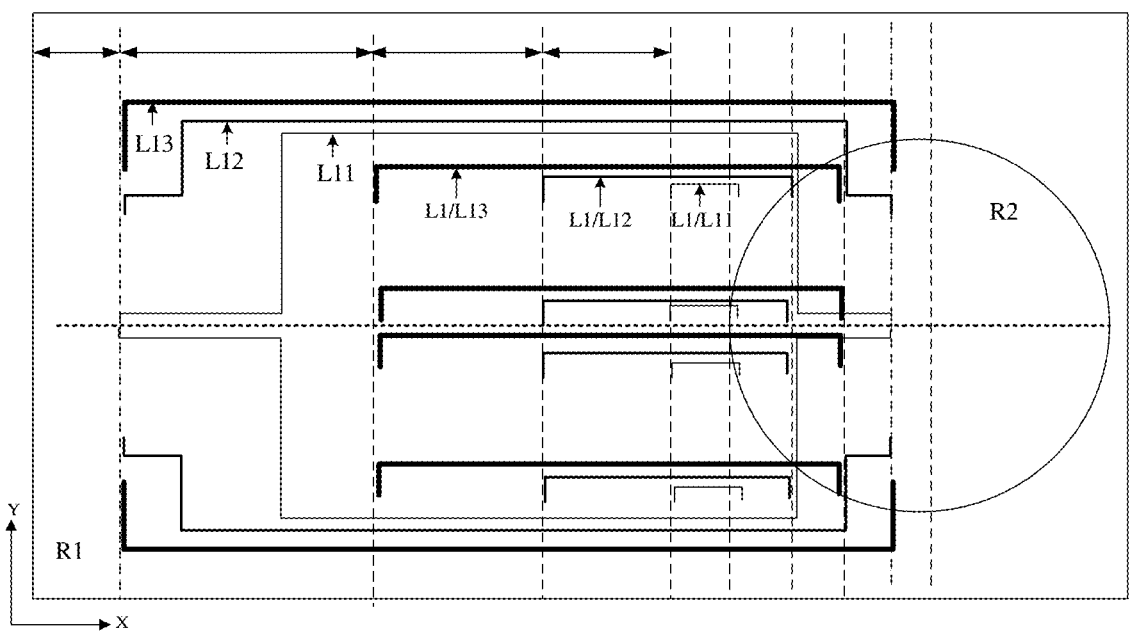

FIG. 5D is a schematic diagram of conductive lines in a display panel provided by an embodiment of the present disclosure. FIG. 5D illustrates the conductive line L1. As illustrated in FIG. 5D, the conductive line L1 includes a first conductive line L11, a second conductive line L12, and a third conductive line L13. In a display panel with a high PPI, in order to avoid too dense conductive lines, a plurality of conductive line pattern layers may be formed, and an insulating layer is arranged between the different conductive line pattern layers. For example, the first conductive line L11 is located in a first conductive line pattern layer, the second conductive line L12 is located in a second conductive line pattern layer, and the third conductive line L13 is located in a third conductive line pattern layer. Of course, in other embodiments, a plurality of conductive lines in other forms can also be provided. For example, one conductive line L1 is formed by several conductive parts located in different conductive line pattern layers. For example, the several conductive parts located in different conductive line pattern layers may be connected to one another through via holes penetrating an insulating layer.

Figure 5E:
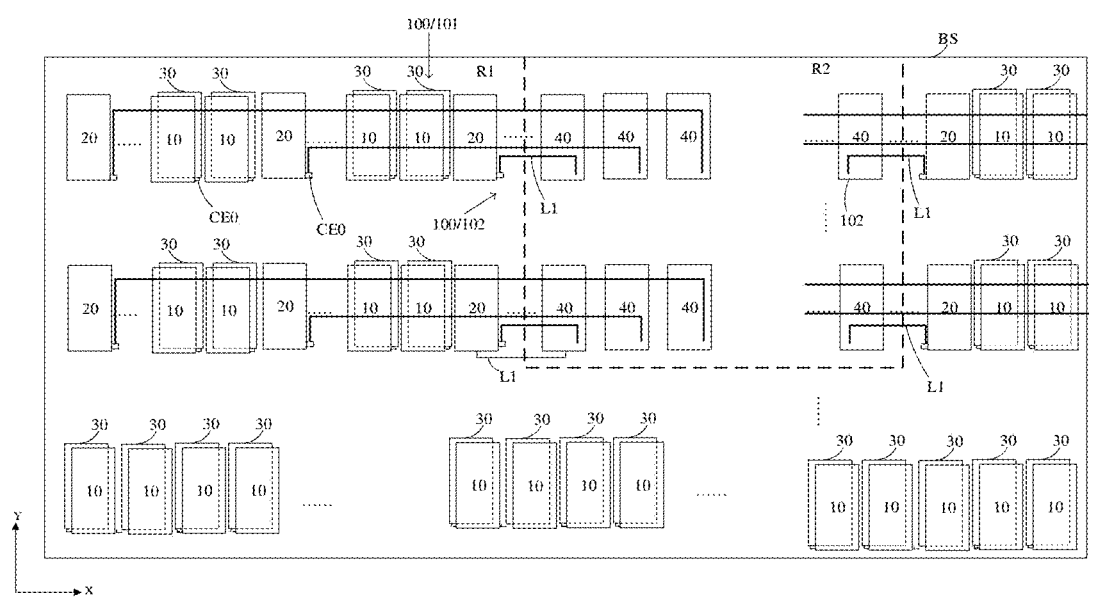

FIG. 5E illustrates the first light-emitting element 30, the second light-emitting element 40, the first pixel circuit 10, the second pixel circuit 20, a connecting element CE0, and the conductive line L1. Each pixel circuit is connected to a light-emitting element through a connecting element CE0. That is, each pixel unit has one connection element CE0. That is, the first pixel circuit 10 is connected to the first light-emitting element 30 through the connecting element CE0, and the second pixel circuit 20 is connected to the second light-emitting element 40 through the connecting element CE0. For example, one end of the conductive line L1 is connected to the second pixel circuit 20 through the connecting element CE0, and the other end of the conductive line L1 is connected to the second light-emitting element 40.

As illustrated in FIG. 5E, one conductive line L1 passes through the region where the pixel circuit of the pixel unit is located to respectively connect the second pixel circuit 20 and the second light-emitting element 40 on both sides of the pixel unit. For example, the region where the pixel circuit of the pixel unit is located overlaps with a plurality of conductive lines L1 passing through the region, so that the pixel circuit and the conductive lines overlapping with the pixel circuit are coupled to form a parasitic capacitance, which causes a difference in brightness to form a display defect such as stripes (Mura). The region in the first display region R1 where the second pixel circuit 20 is disposed can be called the auxiliary region Ra (as illustrated in FIG. 1 and FIG. 3), and the auxiliary region Ra can also be called a transition region, due to the coupling of the conductive line and the pixel circuit, the auxiliary region (transition region) tends to have darker brightness, and the darker pixel unit is the pixel unit (first pixel unit) in the first display region R1, not the second light-emitting element 40 in the second display region R2. For example, the case of that the auxiliary region is darker is more obvious in the case of high gray scale than in the case of low gray scale. In FIG. 5E, one first pixel circuit 10 overlaps with two conductive lines L1 at most as an example. In other embodiments, one first pixel circuit 10 may also overlap with more conductive lines L1. For example, as illustrated in FIG. 5C, in some embodiments, one first pixel circuit 10 may overlap with 10-15 conductive lines L1. How many conductive lines L1 overlap with one first pixel circuit 10 can be determined according to needs.

In some embodiments, the size of the first pixel circuit 10 can be compressed in the first direction X to obtain the region where the second pixel circuit 20 is disposed. For example, as illustrated in FIG. 5E, in the auxiliary region, one column of second pixel circuits 20 is disposed every other a predetermined column of first pixel circuits 10. For example, the number of columns of first pixel circuits 10 between two adjacent columns of second pixel circuits 20 can be determined according to needs.

Figure 6A:
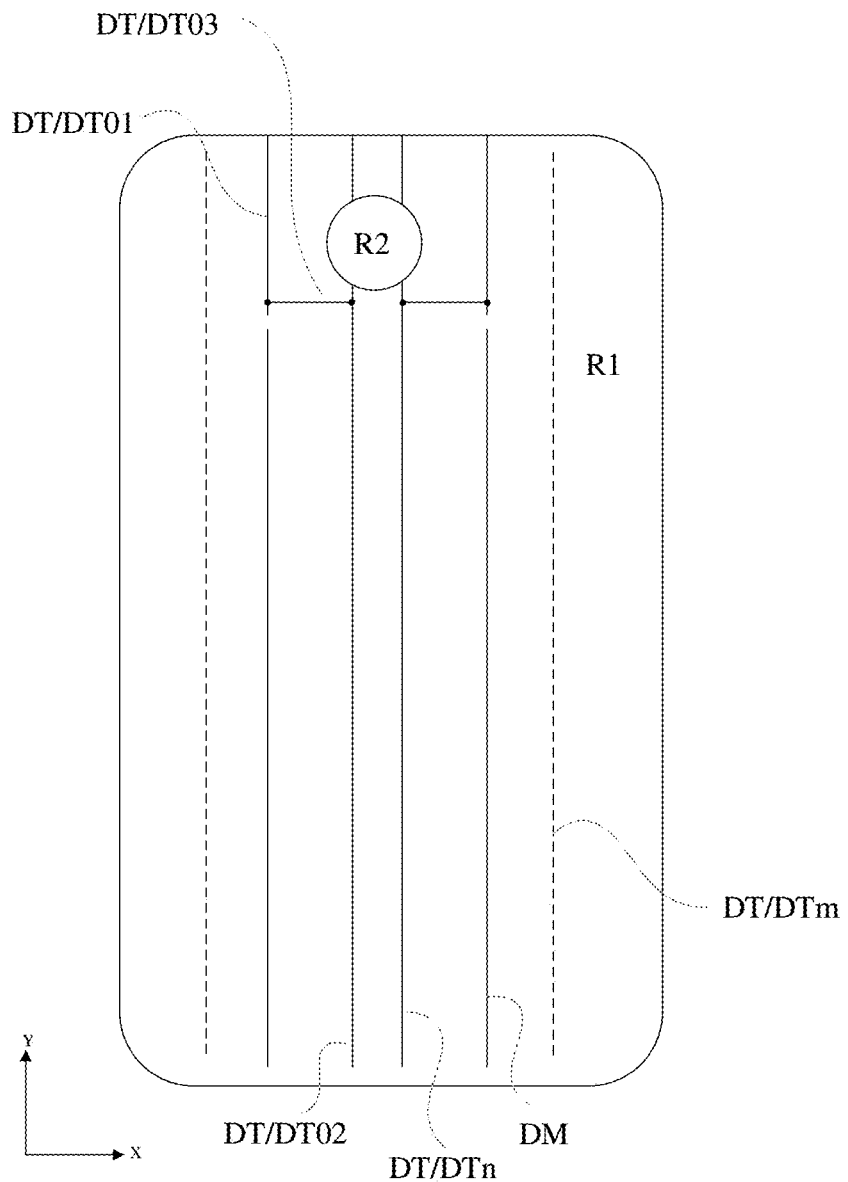
FIG. 6A is a schematic diagram of a data line in a display panel.
Figure 6B:
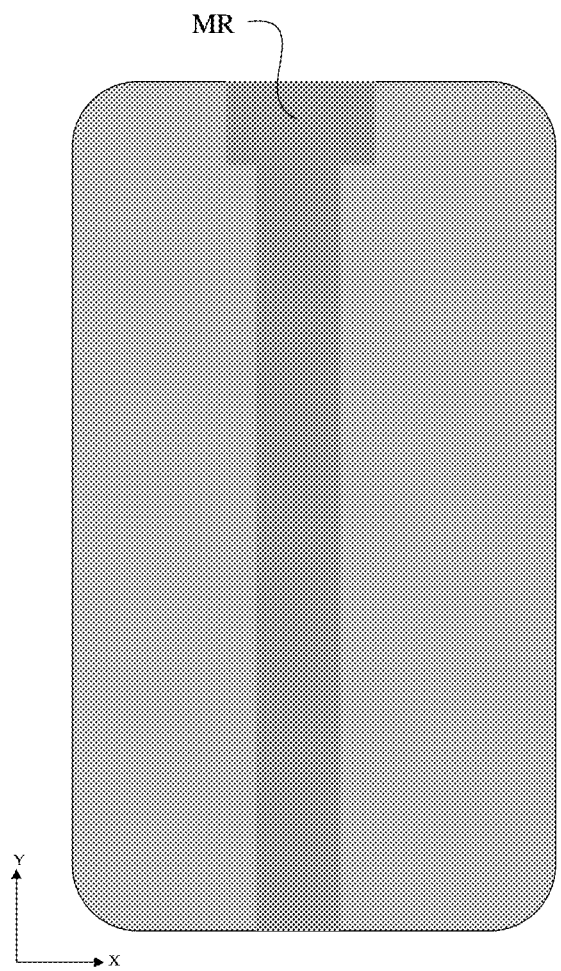
FIG. 6B is a schematic diagram of a display panel with display defect.
Figure 6C:
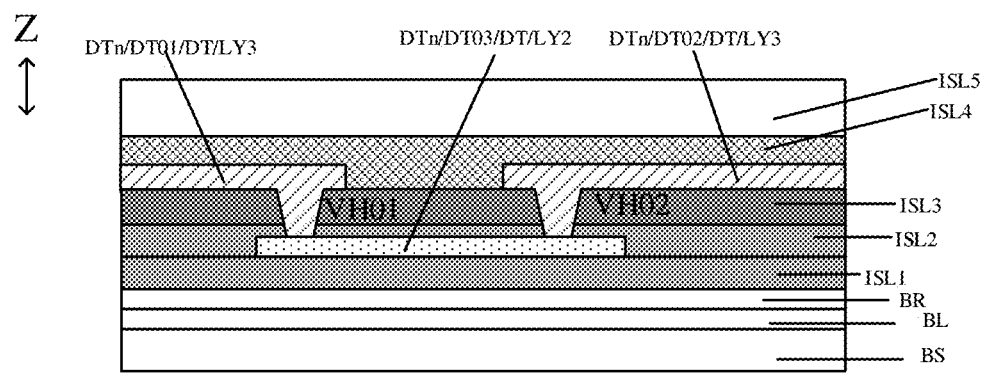
FIG. 6C is a cross-sectional view of a data line formed in segments in a display panel.

FIG. 6A is a schematic diagram of a data line in a display panel. FIG. 6B is a schematic diagram of a display panel with display defect. FIG. 6C is a cross-sectional view of a data line formed in segments in a display panel.

As illustrated in FIG. 6A, the second display region R2 is a light-transmitting display region, the second pixel circuit 20 is separated from the second light-emitting element 40, and the second pixel circuit 20 is arranged in the first display region R1, then the data line of the second pixel unit 102 (referring to FIG. 3) are formed in segments. That is, as illustrated in FIG. 6A, the data line DTn includes a first portion DT01, a second portion DT02, and a third portion DT03. As illustrated in FIG. 6A, the first portion DT01 and the second portion DT02 both extend in the second direction Y, the third portion DT03 extends in the first direction X, and the first portion DT01 and the second portion DT02 are connected by the third portion DT03. Because the data line DTn includes a vertical portion and a horizontal portion, the length of the data line DTn is longer than the length of the data line DTm including only a vertical portion, and the load of the data line DTn is greater than the load of the data line DTm; therefore, as illustrated in FIG. 6B, the display panel has display defects with dark vertical stripes during display. FIG. 6B illustrates dark vertical stripes MR. In the embodiments of the present disclosure, data lines may be divided into data lines DTm and data lines DTn, and the data line DTm may be referred to as first-type data line DTm, and the data line DTn may be referred to as second-type data line DTn. For example, the first-type data line DTm extends in the second direction Y, and the second-type data line DTn includes a portion extending in the first direction X and a portion extending in the second direction Y. For example, in the embodiment of the present disclosure, the first direction X is the row direction of the pixel units, and the second direction Y is the column direction of the pixel units, but not limited thereto. For the sake of clarity, only two second-type data lines DTn are illustrated in the FIG. 6A. In the display panel, a plurality of data lines DTn may be provided as required, so as to form a plurality of third portions DT03, and the plurality of third portions DT03 are arranged close to the second display region R2. In this case, the display panel is prone to display defects (Mura) due to uneven visible brightness caused by the arrangement of the third portion DT03.

As illustrated in FIG. 6C, the display panel includes a base substrate BS and various structures on the base substrate BS. As illustrated in FIG. 6C, a buffer layer BL is disposed on the base substrate BS, an isolation layer BR is disposed on the buffer layer BL, a first insulating layer ISL1 is disposed on the isolation layer BR, a third portion DT03 of the second-type data line DTn is disposed on the first insulating layer ISL1, a second insulating layer ISL2 and a third insulating layer ISL3 are disposed on the third portion DT03 of the second-type data line DTn, a first portion DT01 and a second portion DT02 of the second-type data line DTn are disposed on the third insulating layer ISL3, and a fourth insulating layer ISL4 and a fifth insulating layer ISL5 are disposed on the first portion DT01 and the second portion DT02 of the second-type data line DTn. As illustrated in FIG. 6C, the third portion DT03 of the second-type data line DTn is disposed in the second conductive layer LY2, the first portion DT01 and the second portion DT02 of the second-type data line DTn are disposed in the third conductive layer LY3.

As illustrated in FIG. 6C, the first portion DT01 is connected to the third portion DT03 through a via hole VH01 penetrating both the third insulating layer ISL3 and the second insulating layer ISL2, and the second portion DT02 is connected to the third portion DT03 through a via hole VH02 penetrating both the third insulating layer ISL3 and the second insulating layer ISL2.

Figure 7A:
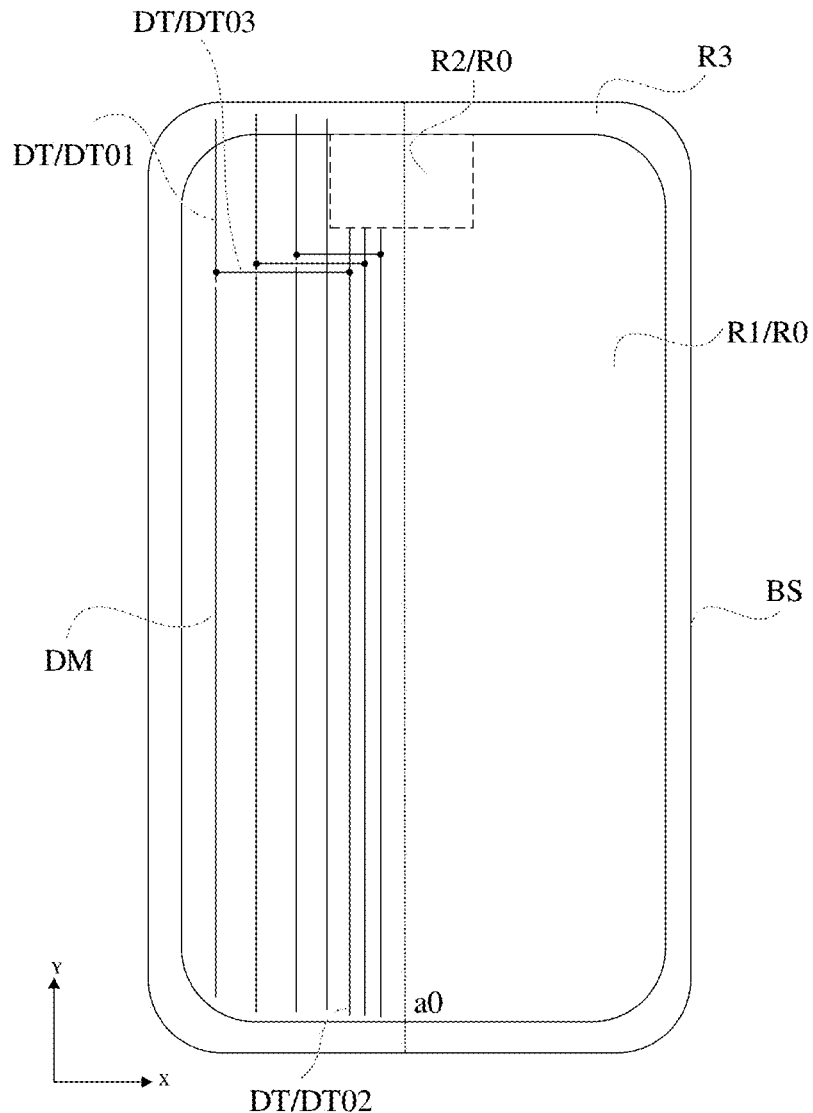
FIG. 7A is a schematic diagram of a display panel provided by an embodiment of the present disclosure.
Figure 7B:
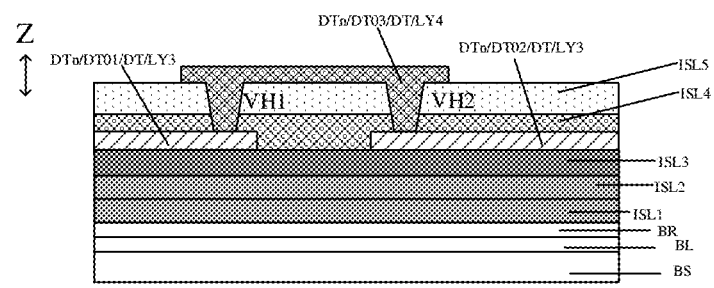
FIG. 7B is a cross-sectional view of a data line formed in segments in a display panel.
Figure 7C:
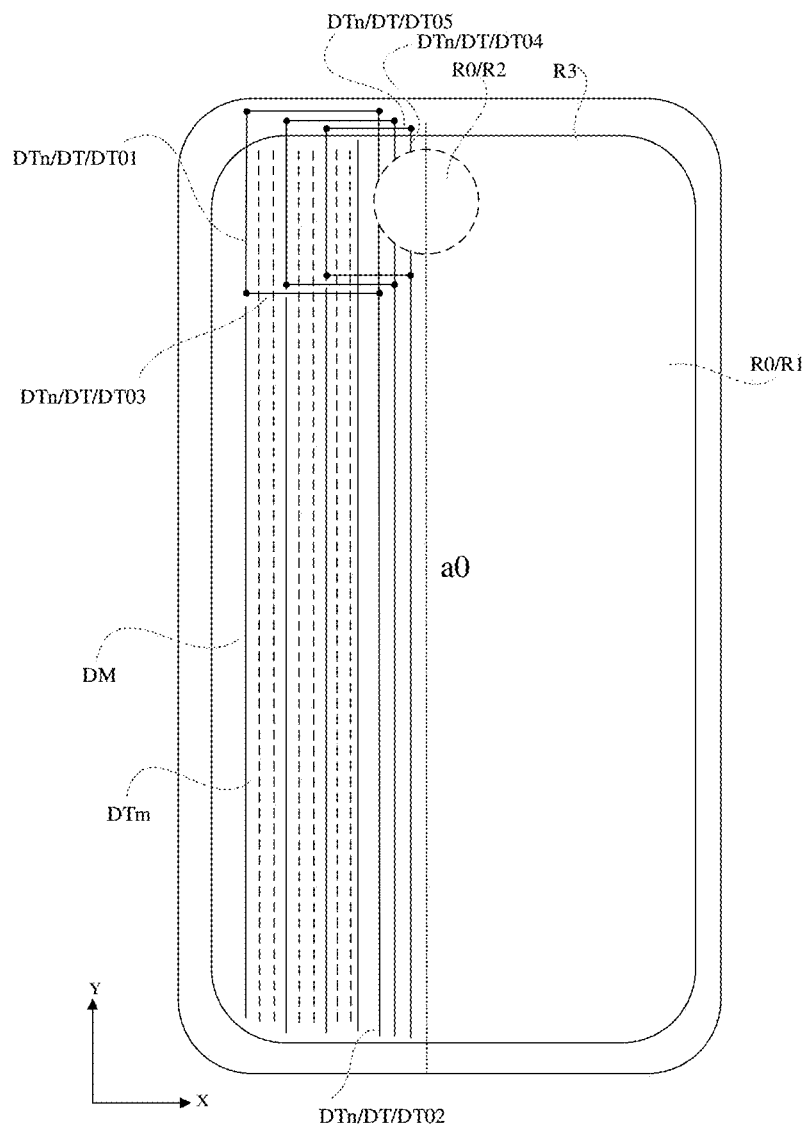
FIG. 7C is a schematic diagram of a display panel provided by an embodiment of the present disclosure.

FIG. 7A is a schematic diagram of a display panel provided by an embodiment of the present disclosure. FIG. 7B is a cross-sectional view of a data line formed in segments in a display panel. FIG. 7C is a schematic diagram of a display panel provided by an embodiment of the present disclosure.

FIG. 7A illustrates three second-type data lines DTn and eight first-type data lines DTm. The number of the second-type data lines DTn and the number of first-type data lines DTm can be determined as required.

For example, referring to FIG. 2, FIG. 3, FIG. 5E, FIG. 7A and FIG. 7B, at least one embodiment of the present disclosure provides a display panel, and the display panel includes: a base substrate BS, a pixel unit 100, and a data line DT. The pixel unit 100 is located on the base substrate BS, and includes a pixel circuit 100a and a light-emitting element 100b. The pixel circuit 100a is configured to drive the light-emitting element 100b to emit light, and the pixel circuit 100a includes a driving transistor and a data writing transistor, and the driving transistor is connected to the data write transistor. The data line DT is connected to the data writing transistor. The data line DT includes a plurality of first-type data lines DTm and a plurality of second-type data lines DTn, and the plurality of first-type data lines DTm are arranged in the first direction X, the first-type data line DTm extends in the second direction Y, and the first direction X intersects with the second direction Y. The second-type data line DTn includes a first portion DT01, a second portion DT02, and a third portion DT03, and the first portion DT01 and the second portion DT02 are connected by the third portion DT03, and the first portion DT01 and the second portion DT02 both extend in the second direction Y, and the third portion DT03 extends in the first direction X. For example, the third portion DT03 is located in the first display region R1.

As illustrated in FIG. 7B, the third portion DT03 and the second portion DT02 are located in different layers, the third portion DT03 and the first portion DT01 are located in different layers, the first portion DT01 is closer to the base substrate BS than the third portion DT03, and, the second portion DT02 is closer to the base substrate BS than the third portion DT03.

As illustrated in FIG. 7B, one end of the third portion DT03 is connected to the first portion DT01 by a via hole VH1 penetrating both the fourth insulating layer ISL4 and the fifth insulating layer ISL5, and the other end of the third portion DT03 is connected to the second portion DT02 by a via hole VH2 penetrating both the fourth insulating layer ISL4 and the fifth insulating layer ISL5.

The embodiment of the present disclosure is described by taking that the fourth insulating layer ISL4 and the fifth insulating layer ISL5 are disposed between the fourth conductive layer LY4 and the third conductive layer LY3 as an example, but not limited thereto, only one insulating layer may also be arranged between the fourth conductive layer LY4 and the third conductive layer LY3. For example, only the fifth insulating layer ISL5 is arranged between the fourth conductive layer LY4 and the third conductive layer LY3. For example, the fifth insulating layer ISL5 is a planarization layer.

For example, as illustrated in FIG. 6C and FIG. 7B, in the embodiment of the present disclosure, the thickness of the fifth insulating layer ISL5 is greater than the thickness of at least one of the fourth insulating layer ISL4, the third insulating layer ISL3, the second insulating layer ISL2, and the first insulating layer ISL1. In some embodiments, the thickness of the fifth insulating layer ISL5 is greater than the thickness of each of the fourth insulating layer ISL4, the third insulating layer ISL3, the second insulating layer ISL2, and the first insulating layer ISL1. For example, the buffer layer BL, the isolation layer BR, the first insulating layer ISL1, the second insulating layer ISL2, the third insulating layer ISL3, the fourth insulating layer ISL4, and the fifth insulating layer ISL5 are all made of insulating materials. At least one of the buffer layer BL, the isolation layer BR, the first insulating layer ISL1, the second insulating layer ISL2, the third insulating layer ISL3 and the fourth insulating layer ISL4 is made of inorganic insulating materials, and the fifth insulating layer ISL5 can be made of organic materials. For example, the inorganic insulating material includes at least one of silicon oxide, silicon nitride, and silicon oxynitride, but is not limited thereto. For example, the organic material includes resin, but is not limited thereto.

Compared with the display panel illustrated in FIG. 6B, in the display panel illustrated in FIG. 7B, the third portion DT03 of the second-type data lines DTn is disposed in the fourth conductive layer LY4. Adjusting the third portion DT03 from the second conductive layer LY2 to the fourth conductive layer LY4 is beneficial to alleviating the display defects of dark stripes caused by the load of the second-type data line DTn being greater than the load of the first-type data line DTm to improve display quality. For example, the sheet resistance of the material of the fourth conductive layer LY4 is less than the sheet resistance of the material of the second conductive layer LY2.

As illustrated in FIG. 7C, in the display panel provided by some embodiments of the present disclosure, the second display region R2 is surrounded by the first display region RE The second-type data line DTn further includes a fourth portion DT04 and a fifth portion DT05. The fourth portion DT04 extends in the second direction Y, the fifth portion DT05 extends in the first direction X, and the first portion DT01 and the fourth portion DT04 are connected by the fifth portion DT05. For example, in some embodiments, the first portion DT01 and the fourth portion DT04 are located in the same layer, and the fifth portion DT05 is not located in the same layer as the first portion DT01 and the fourth portion DT04. For example, in some embodiments, the fifth portion DT05 is located in the fourth conductive layer or the second conductive layer, and the first portion DT01 and the fourth portion DT04 are located in the third conductive layer, but not limited thereto.

As illustrated in FIG. 7C, the fifth portion DT05 is located in the peripheral region R3, and the fourth portion DT04 extends from the display region R0 to the peripheral region R3. As illustrated in FIG. 7C, the fourth portion DT04 extends from one side of the first display region R1, opposite to the side of the second display region R2 where the second portion DT02 is located, to the peripheral region R3.

As illustrated in FIG. 7C, the plurality of first-type data lines DTm and the first portions DT01 of the plurality of second-type data lines DTn are arranged at intervals. The number of the first-type data lines DTm arranged between adjacent first portions DT01 is not limited to that illustrated in the figure, and can be set as required.

The layer in which each portion of the second-type data line DTn is located can be set as needed, as long as two portions connected through a via hole are located in different layers. For example, for each portion of the second-type data line DTn, two portions with different extension directions are located in different layers. Of course, other manners can also be adopted. Each of the first portion DT01 to the fifth portion DT05 illustrated in the figure can also include sub-portions located in different layers.

Figure 8A:
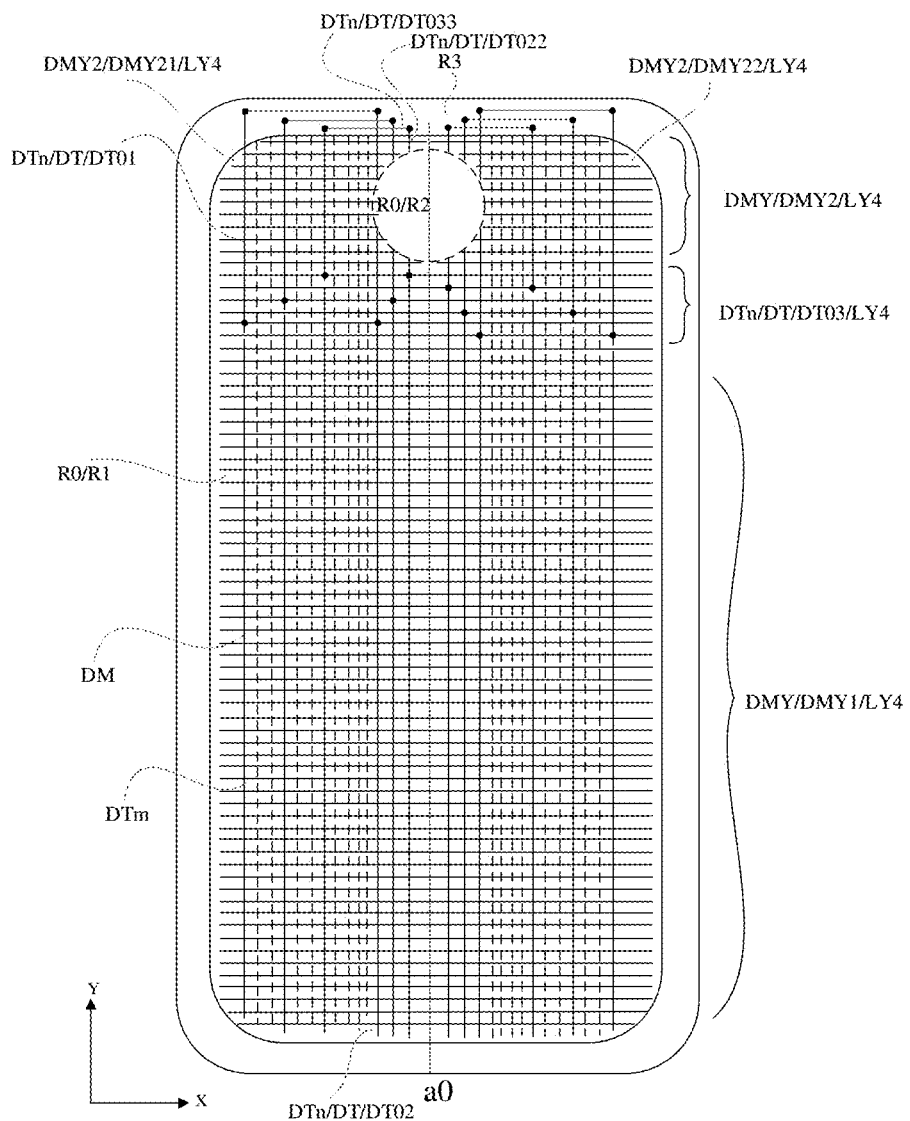
FIG. 8A is a schematic diagram of a display panel provided by an embodiment of the present disclosure.
Figure 8B:
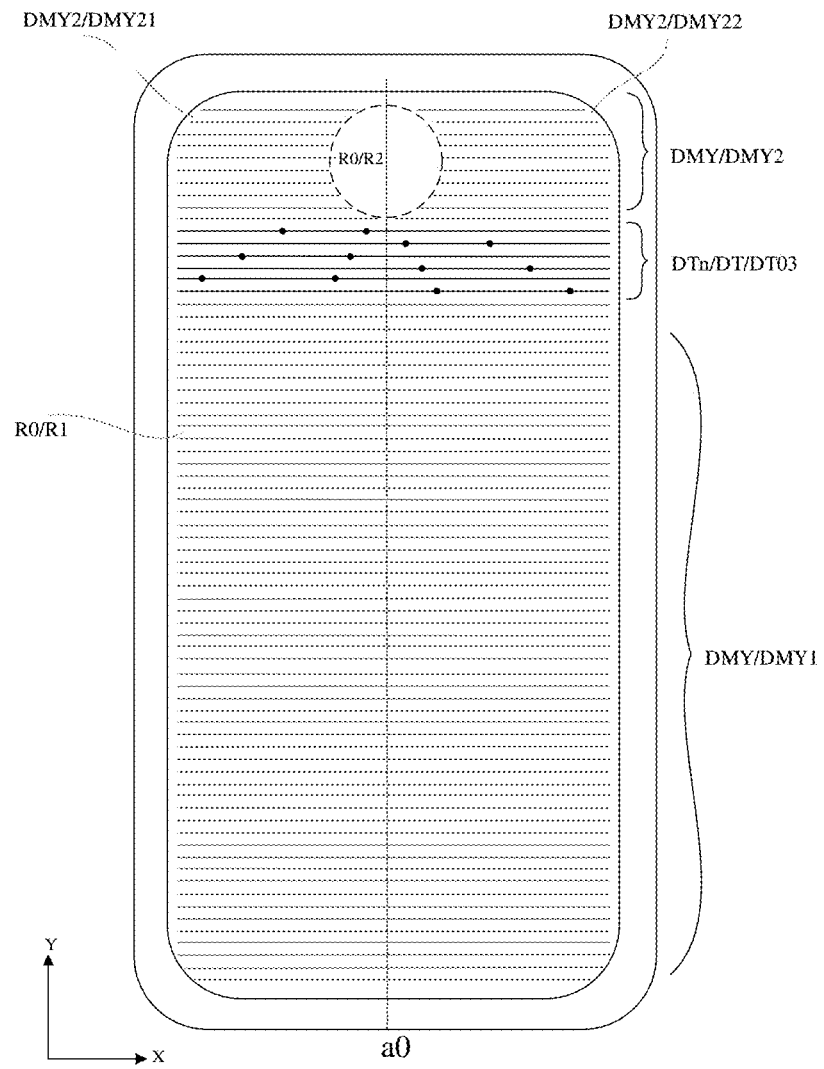
FIG. 8B is a schematic plan view of a dummy line and a third portion of a second-type data line in the display panel illustrated in FIG. 8A.

FIG. 8A is a schematic diagram of a display panel provided by an embodiment of the present disclosure. FIG. 8B is a schematic plan view of a dummy line and a third portion of the second-type data line in the display panel illustrated in FIG. 8A.

For example, as illustrated in FIG. 8A, in order to alleviate the visible Mura that occurs due to the arrangement of the third portion of the second-type data line DTn, for the same second-type data line DTn, the size of the third portion DT03 in the first direction X is greater than or equal to the minimum distance between the first portion DT01 and the second portion DT02 in the first direction X.

In some embodiments of the present disclosure, for example, in order to alleviate the visible Mura that occurs due to the arrangement of third portion of the second-type data lines DTn, the display panel further includes a plurality of dummy lines DMY. For example, the plurality of dummy lines DMY and the third portions DT03 of the second-type data lines DTn are located in the same layer. For example, the dummy line DMY and the third portion DT03 are both located in a fourth conductive layer LY4.

In the display panel provided by some embodiments of the present disclosure, the dummy lines DMY are provided so as to avoid the visible Mura caused by the aggregation of the third portions DT03, and to improve display quality.

For example, as illustrated in FIG. 8A and FIG. 8B, the display panel includes a plurality of third portions DT03. In order to alleviate or eliminate the visible Mura and improve the display quality, the plurality of dummy lines DMY and the plurality of third portions DT03 are uniformly arranged in the display panel.

For example, as illustrated in FIG. 8A and FIG. 8B, the extension direction of the dummy line DMY is the same as the extension direction of the third portion DT03. As illustrated in FIG. 8A and FIG. 8B, the dummy line DMY extends in the first direction X, and the third portion DT03 extends in the first direction X.

For example, the dummy line DMY is connected to a constant voltage line. For example, the constant voltage line includes at least one of a first power supply line, a second power supply line, and an initialization signal line. For example, the first power supply line may be a first power supply line PL1 mentioned later, the second power supply line may be a second power supply line PL2 mentioned later, and the initialization signal line may be an initialization signal line INT mentioned later.

Referring to FIG. 6A, FIG. 7A, FIG. 7C, FIG. 8A and FIG. 8B, the display panel also includes a dummy data line DM, the dummy data line DM is a disconnected data line, the dummy data line DM is disconnected from the first portion DT01 of the second-type data line DT, the dummy data line DM is located between two first-type data lines DTm, and is disconnected from the first portion DT01 of a second-type data line DT between the two first-type data lines DTm. A part of the second portion DT02 of the second-type data line DTn and the third portion DT03 of the second-type data line DTn are not located between the two first-type data lines DTm. For example, the dummy data line DM is not input with a data signal like that on the data line DT. For example, the dummy data line DM may be connected to the constant voltage line, but not limited thereto. For example, the pixel circuit overlapping with the dummy data line DM may be a dummy pixel circuit, and the dummy pixel circuit is not connected to the light-emitting element.

For example, as illustrated in FIG. 8A and FIG. 8B, in order to improve the etching uniformity, the display panel further includes a plurality of dummy data lines DM. For example, the plurality of dummy data lines DM, the first portion DT01 of the second-type data line DTn, and the second portion DT02 of the second-type data line DTn are all located in the same layer.

Figure 9A:
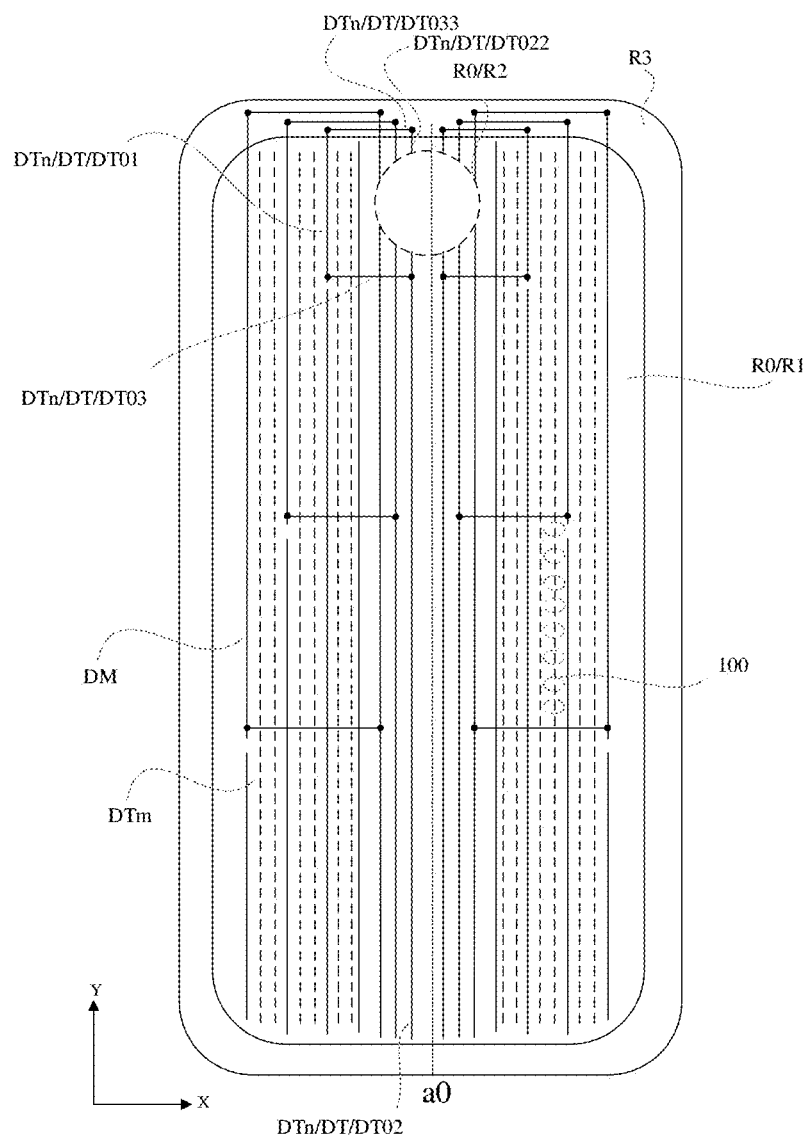
FIG. 9A is a schematic diagram of a display panel provided by an embodiment of the present disclosure.
Figure 9B:
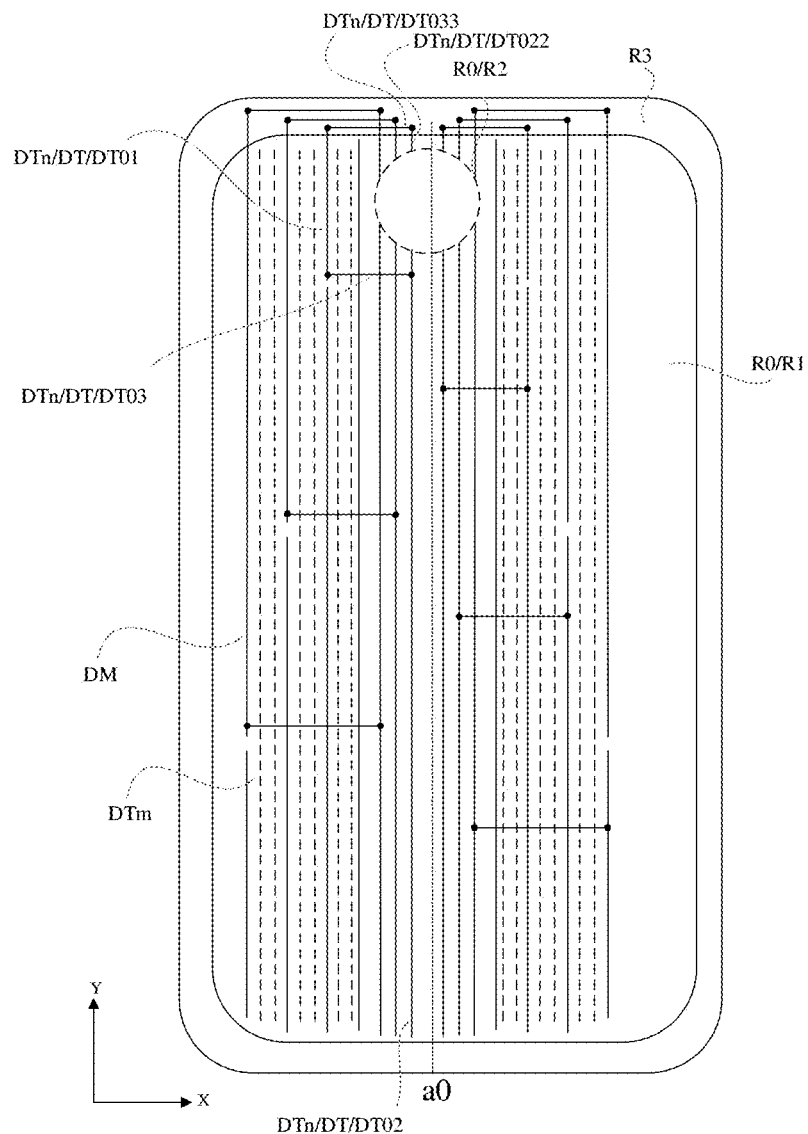
FIG. 9B is a schematic diagram of a display panel provided by another embodiment of the present disclosure.
Figure 9C:
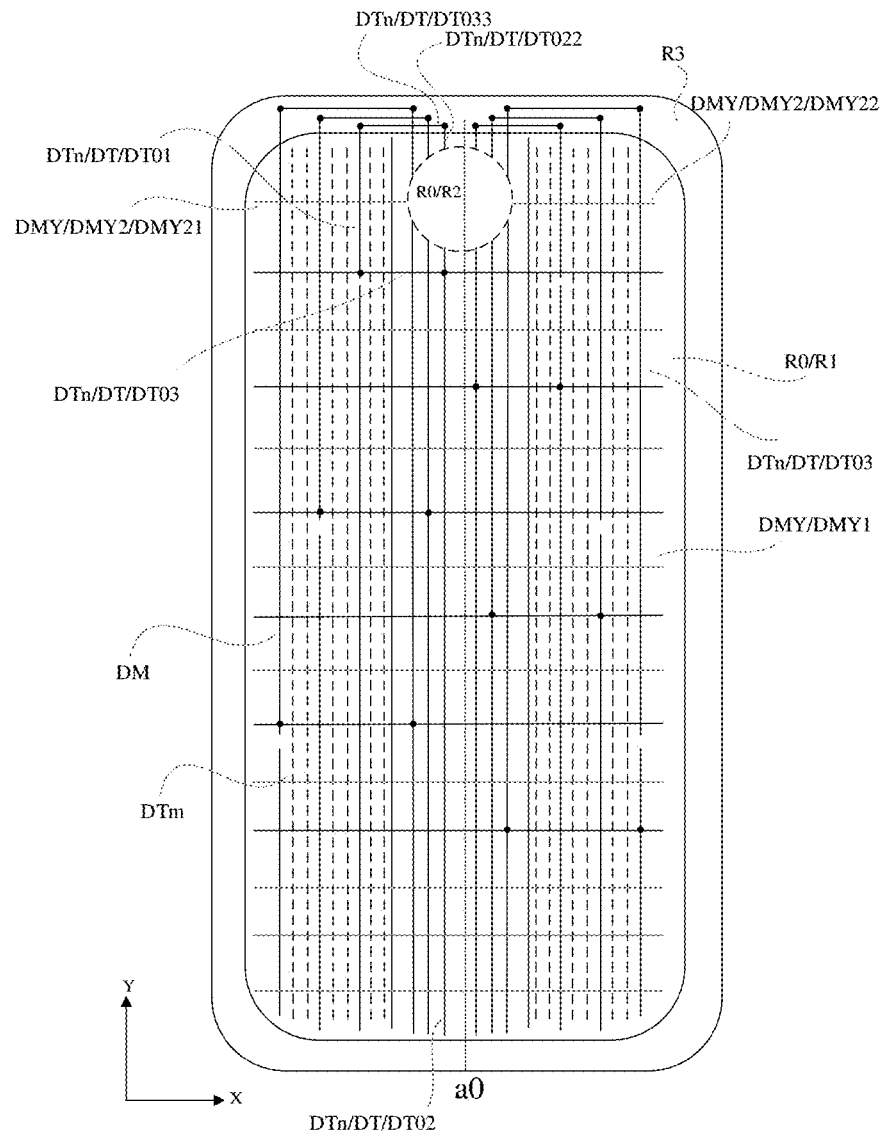
FIG. 9C is a schematic diagram of a display panel provided by another embodiment of the present disclosure.
Figure 9D:
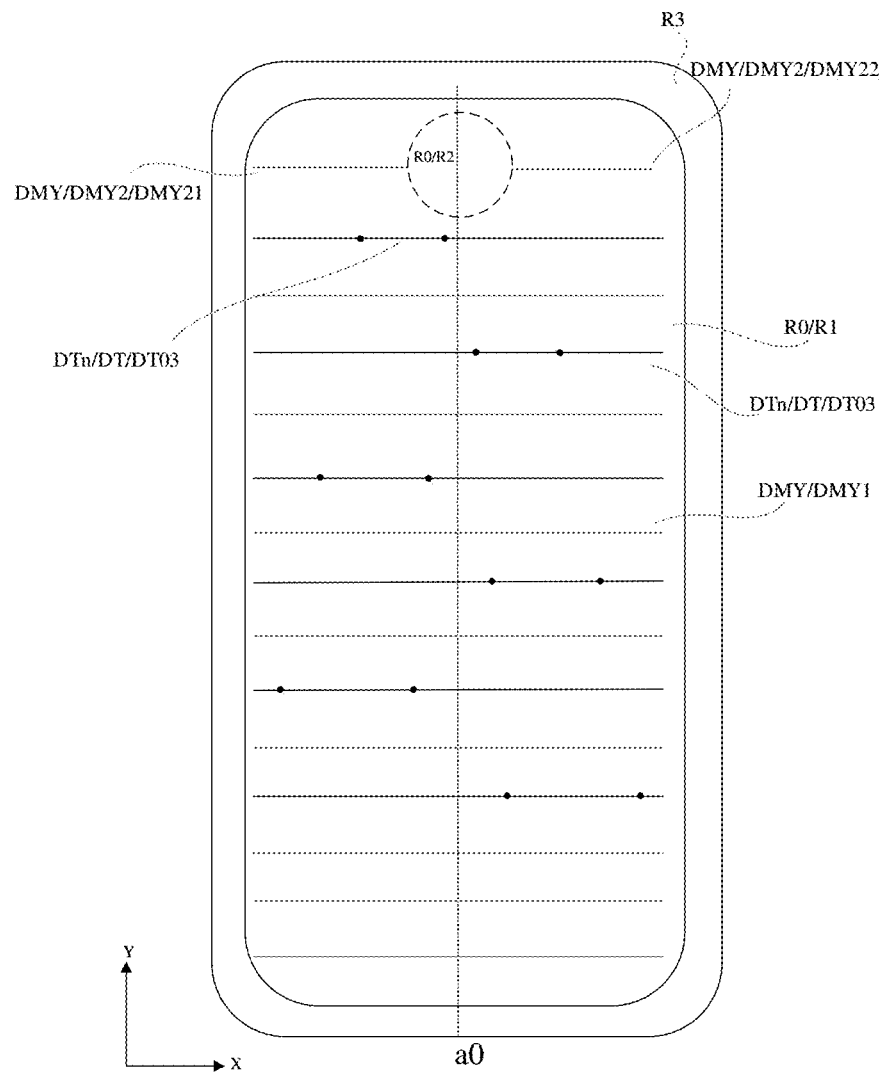
FIG. 9D is a schematic plan view of a dummy line and a third portion of the second-type data line DTn in the display panel illustrated in FIG. 9C.

FIG. 9A is a schematic diagram of a display panel provided by an embodiment of the present disclosure. FIG. 9B is a schematic diagram of a display panel provided by another embodiment of the present disclosure. FIG. 9C is a schematic diagram of a display panel provided by another embodiment of the present disclosure. FIG. 9D is a schematic plan view of the dummy line and the third portion of the second-type data line DTn in the display panel illustrated in FIG. 9C.

For example, in order to reduce the influence of the third portion DT03 on the pixel circuit and reduce the load of the second-type data line, the third portion DT03 is located between the pixel circuits of two adjacent pixel units in the second direction Y.

For example, as illustrated in FIG. 9A to FIG. 9D, the display panel includes a plurality of third portion DT03, and in order to alleviate visible Mura, the plurality of third portions DT03 are arranged in the display panel in a dispersed manner. For example, as illustrated in FIG. 9A, the distance between two adjacent third portions DT03 in the second direction Y is greater than or equal to the sum of the sizes of two pixel units 100 in the second direction Y. FIG. 9A refers to the pixel unit 100 with an elliptical dashed border. For the sake of clarity, FIG. 9 only illustrates eight pixel units 100 located between two adjacent third portions DT03.

For example, the distance between two adjacent third portions DT03 in the second direction Y is greater than or equal to the sum of the sizes of ten pixel units 100 in the second direction Y. The space of two adjacent third portions DT03 in the second direction Y may be determined according to the degree of dispersion of the plurality of third portions DT03.

For example, as illustrated in FIG. 9A to FIG. 9D, in order to alleviate the visible Mura, a plurality of third portions DT03 are uniformly arranged within at least half of the size of the display panel in the second direction Y. For example, as illustrated in FIG. 9C and FIG. 9D, the plurality of third portions DT03 are uniformly arranged in a region of the first display region R1 on one side of the second display region R2. For example, the distance between the two farthest third portions DT03 is greater than or equal to half of the size of the display region R0 in the second direction Y. The size of the display panel in the second direction Y may refer to the length of the display panel in the second direction Y. In FIG. 6A, FIG. 7A, FIG. 7C, FIG. 8A, FIG. 8B, and FIG. 9A to FIG. 9D, a via hole penetrating an insulating layer for connecting two components are indicated by a black dot. The two components that cross at the position of the black dot are connected, and the components that cross at the position without the black dot are not connected, and are separated by an insulating layer therebetween.

As illustrated in FIG. 9C and FIG. 9D, the display panel further includes a plurality of dummy lines DMY. For the dummy lines DMY, reference may be made to the previous description, which will not be repeated here.

FIG. 6A, FIG. 7A, FIG. 7C, FIG. 8A, FIG. 8B, and FIG. 9A to FIG. 9D illustrate a center line a0 of the display panel. For example, the display panel is arranged symmetrically with respect to the center line a0. For example, the center line a0 is parallel with the second direction Y.

As illustrated in FIG. 6A, FIG. 7A, FIG. 7C, FIG. 8A, FIG. 8B, and FIG. 9A to FIG. 9D, some dummy lines DMY are disconnected in the second display region R2, and on opposite sides of the second display region R2, the dummy lines DMY includes a first dummy portion DMY1 located on one side of the second display region R2 and a second dummy portion DMY2 on the other side of the second display region R2. The dummy lines DMY do not pass through the second display region R2.

As illustrated in FIG. 6A, FIG. 7A, FIG. 7C, FIG. 8A, FIG. 8B, and FIG. 9A to FIG. 9D, the display panel includes a display region R0 and a peripheral region R3, and the display region R0 includes a first display region R1 and a second display region R2. In other words, the base substrate BS has a display region R0 and a display region R3, and the peripheral region R3 is located on at least one side of the display region R0.

For example, referring to FIG. 2 and FIG. 3, the pixel unit 100 is located on the base substrate BS, and includes a pixel circuit 100a and a light-emitting element 100b, the pixel circuit 100a is configured to drive the light-emitting element 100b, and the pixel circuit 100b includes a driving transistor T1 (referring to FIG. 10A) and a data writing transistor T2 (referring to FIG. 10A), the drive transistor and the data writing transistor are connected with each other.

Figure 10A:
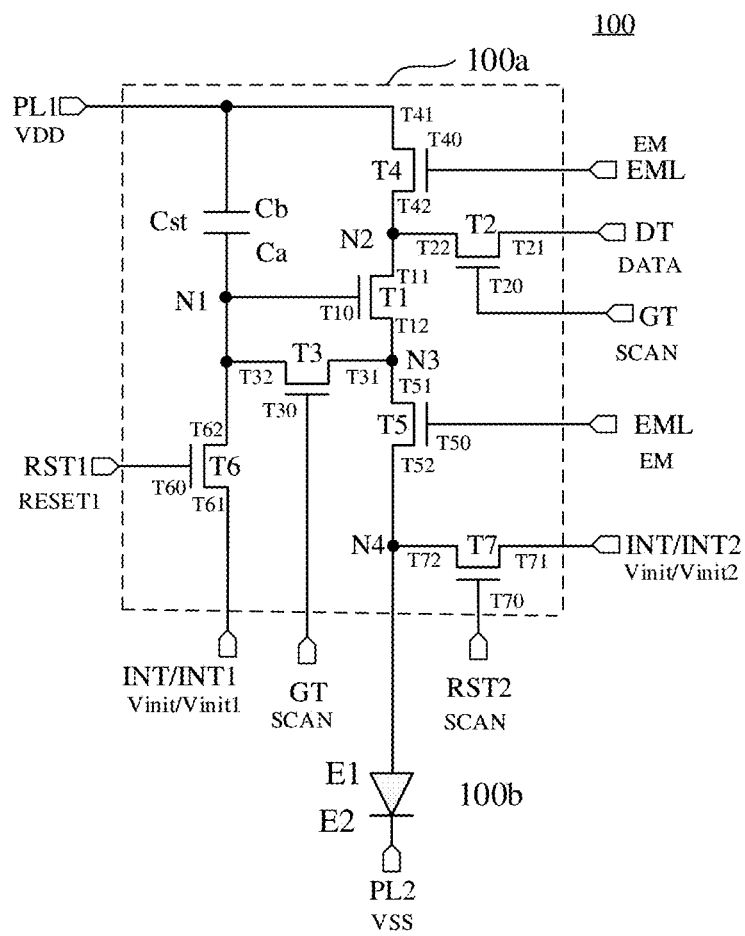
FIG. 10A is a schematic diagram of a pixel circuit provided by an embodiment of the present disclosure.
Figure 10B:
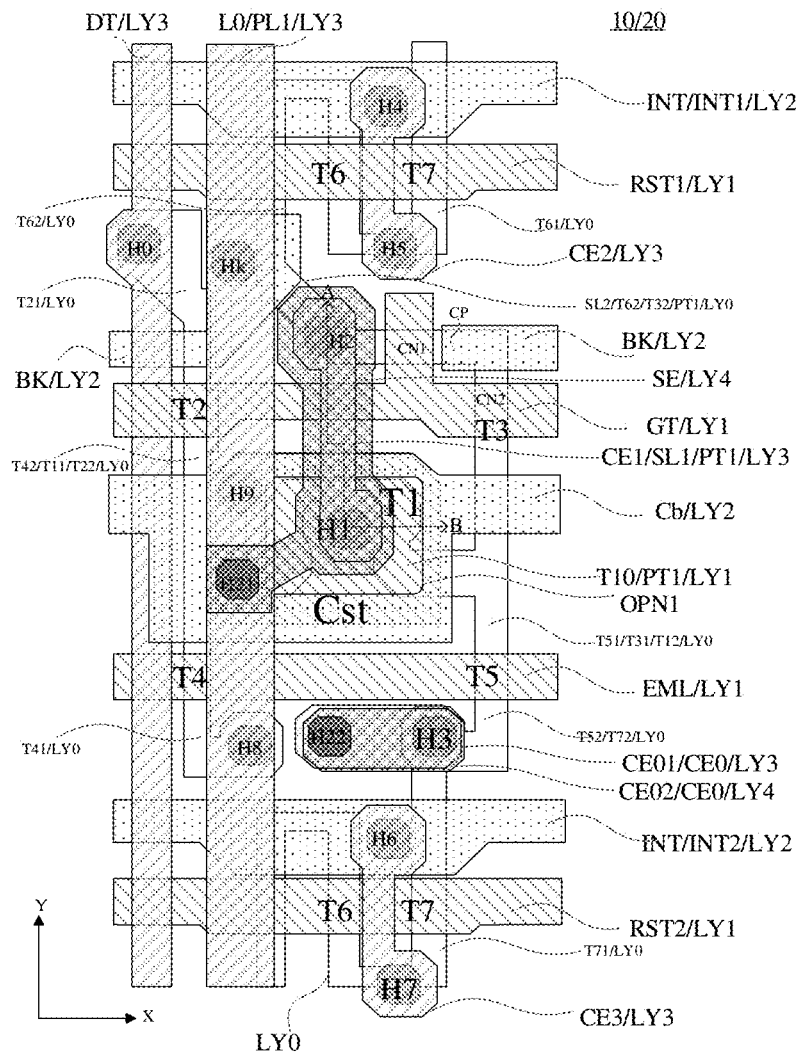
FIG. 10B is a layout diagram of a pixel circuit provided by an embodiment of the present disclosure.

For example, referring to FIG. 10A and FIG. 10B, the data line DT is connected to the data writing transistor T2 and is configured to provide a data signal to the pixel circuit 100a.

Figure 10C:
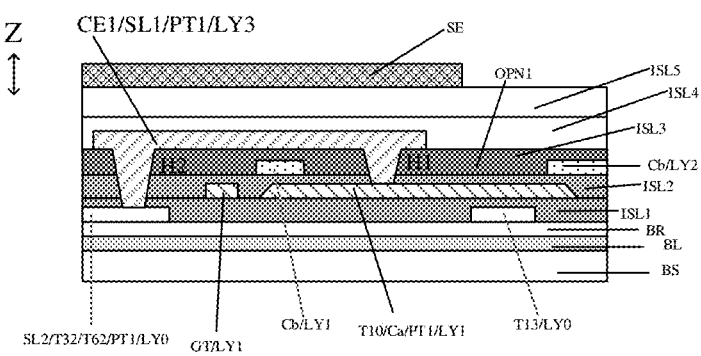
FIG. 10C is a cross-sectional view taken along the line A-B of FIG. 10B.
Figure 10D:
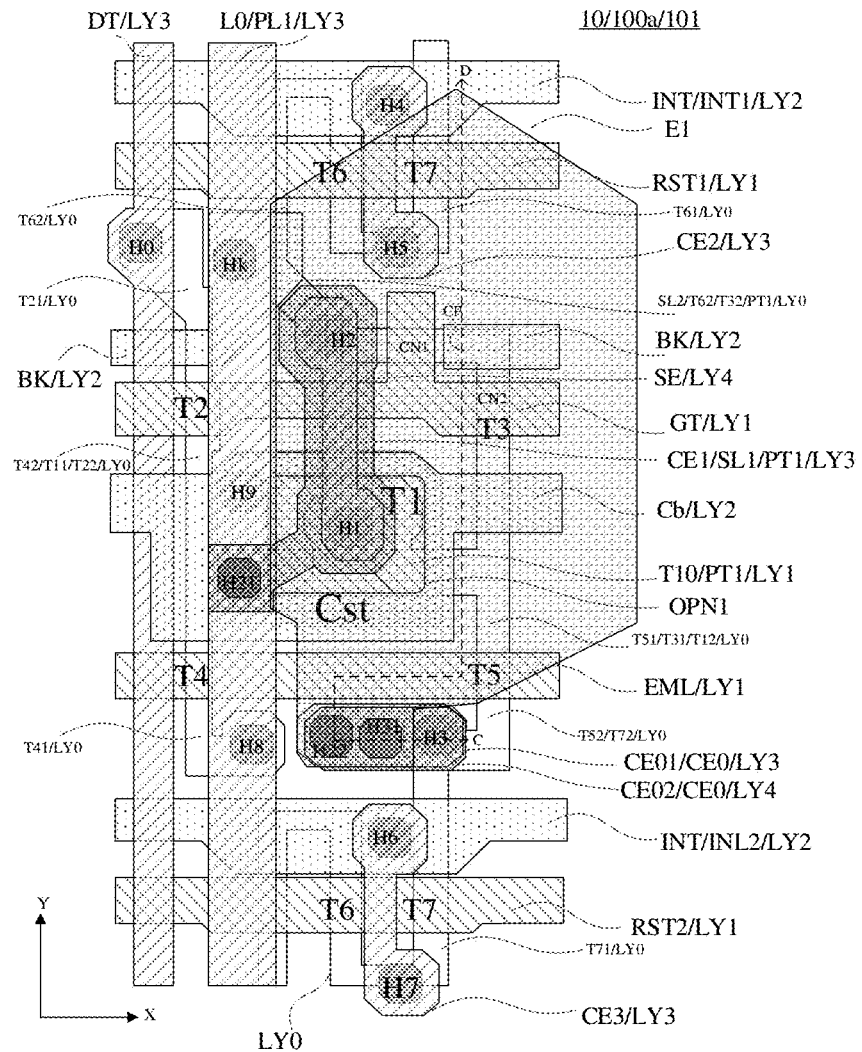
FIG. 10D is a layout diagram of a pixel circuit provided by an embodiment of the present disclosure.
Figure 10E:
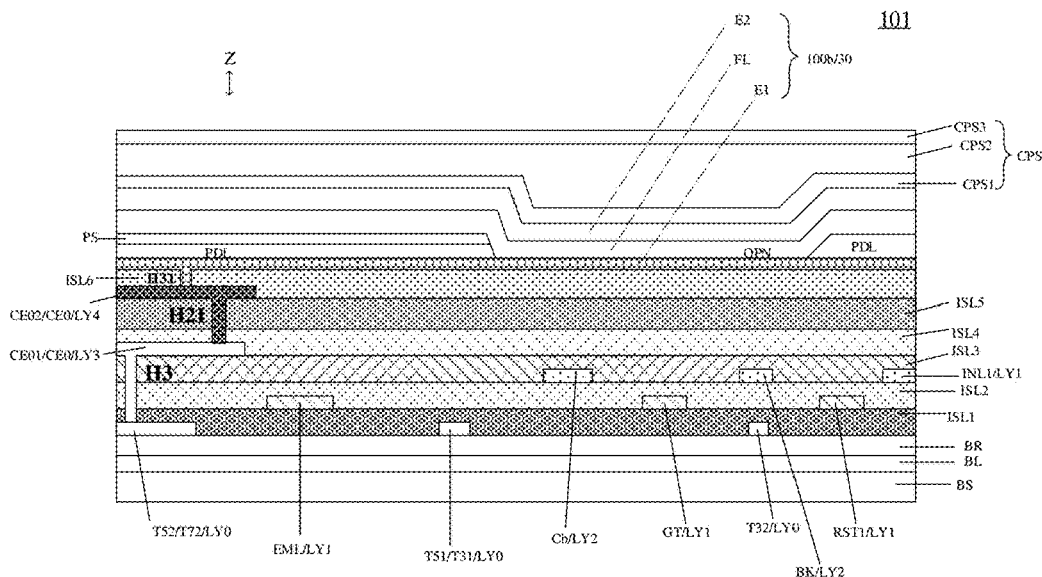
FIG. 10E is a cross-sectional view taken along the line C-D of FIG. 10D.

FIG. 10A is a schematic diagram of a pixel circuit in a display panel provided by an embodiment of the present disclosure. FIG. 10B is a layout diagram of a pixel circuit in a display panel provided by an embodiment of the present disclosure. FIG. 10C is a cross-sectional view taken along the line A-B of FIG. 10B. FIG. 10D is a layout diagram of a pixel circuit in a display panel provided by an embodiment of the present disclosure. FIG. 10E is a cross-sectional view taken along the line C-D of FIG. 10D. The pixel circuit illustrated in FIG. 10A may be a low temperature polysilicon (LTPS) AMOLED pixel circuit commonly used in the related art.

FIG. 10A illustrates a pixel circuit of one pixel unit of the display panel. As illustrated in FIG. 10A, the pixel unit 100 includes the pixel circuit 100a and the light-emitting element 100b. The pixel circuit 100a includes six switching transistors (T2-T7), one driving transistor T1, and one storage capacitor Cst. The six switching transistors are respectively a data writing transistor T2, a threshold compensation transistor T3, a first light-emitting control transistor T4, a second light-emitting control transistor T5, a first reset transistor T6, and a second reset transistor T7. The light-emitting element 100b includes a first electrode E1 and a second electrode E2, and a light-emitting functional layer located between the first electrode E1 and the second electrode E2. For example, the first electrode E1 is an anode, and the second electrode E2 is a cathode. Generally, the threshold compensation transistor T3 and the first reset transistor T6 reduce leakage current by adopting double-gate thin film transistors (TFT).

As illustrated in FIG. 10A, the display panel includes a gate line GT, a data line DT, a first power supply line PL1, a second power supply line PL2, a light-emitting control signal line EML, an initialization signal line INT, a reset control signal line RST, and the like. For example, the reset control signal line RST includes a first reset control signal line RST1 and a second reset control signal line RST2. The first power supply line PL1 is configured to provide a constant first voltage signal VDD to the pixel unit 100, the second power supply line PL2 is configured to provide a constant second voltage signal VSS to the pixel unit 100, and the first voltage signal VDD is greater than the second voltage signal VSS. The gate line GT is configured to provide a scan signal SCAN to the pixel unit 100, the data line DT is configured to provide a data signal DATA (data voltage VDATA) to the pixel unit 100, the light-emitting control signal line EML is configured to provide a light-emitting control signal EM to the pixel unit 100, the first reset control signal line RST1 is configured to provide a first reset control signal RESET1 to the pixel unit 100, and the second reset control signal line RST2 is configured to provide the scan signal SCAN to the pixel unit 100. The first initialization signal line INT1 is configured to provide a first initialization signal Vinit1 to the pixel unit 100. The second initialization signal line INT2 is configured to provide a second initialization signal Vinit2 to the pixel unit 100. For example, the first initialization signal Vinit1 and the second initialization signal Vinit2 are constant voltage signals, and their magnitudes may be between the first voltage signal VDD and the second voltage signal VSS, but are not limited thereto. For example, the first initialization signal Vinit1 and the second initialization signal Vinit2 may both be less than or equal to the second voltage signal VSS. For example, in some embodiments, the first initialization signal line INT1 and the second initialization signal line INT1 are connected with each other, and are both configured to provide an initialization signal Vinit to the pixel unit 100, that is, the first initialization signal line INT1 and the second initialization signal line INT2 are both referred to as an initialization signal line INT, and the first initialization signal Vinit1 and the second initialization signal Vinit2 are equal, and both are Vinit.

As illustrated in FIG. 10A, the driving transistor T1 is electrically connected to the light-emitting element 100b, and outputs a driving current to drive the light-emitting element 100b to emit light under the control of the scan signal SCAN, the data signal DATA, the first voltage signal VDD, and the second voltage signal VSS.

For example, the light-emitting element 100b includes an organic light emitting diode (OLED), and the light-emitting element 100b emits red light, green light, blue light, or white light under the driving of its corresponding pixel circuit 100a. For example, one pixel includes a plurality of pixel units. One pixel may include a plurality of pixel units that emit light of different colors. For example, one pixel includes a pixel unit that emits red light, a pixel unit that emits green light, and a pixel unit that emits blue light, but it is not limited to this. The number of pixel units included in a pixel and the light output of each pixel unit can be determined according to needs.

For example, as illustrated in FIG. 10A, a gate electrode T20 of the data writing transistor T2 is connected to the gate line GT, a first electrode T21 of the data writing transistor T2 is connected to the data line DT, and a second electrode T22 of the data writing transistor T2 is connected to a first electrode T11 of the driving transistor T1.

For example, as illustrated in FIG. 10A, the pixel circuit 100a further includes the threshold compensation transistor T3, a gate electrode T30 of the threshold compensation transistor T3 is connected to the gate line GT, a first electrode T31 of the threshold compensation transistor T3 is connected to a second electrode T12 of the driving transistor T1, and a second electrode T32 of the threshold compensation transistor T3 is connected to a gate electrode T10 of the driving transistor T1.

For example, as illustrated in FIG. 10A, the display panel further includes the light-emitting control signal line EML, and the pixel circuit 100a further includes the first light-emitting control transistor T4 and the second light-emitting control transistor T5. A gate electrode T40 of the first light-emitting control transistor T4 is connected to the light-emitting control signal line EML, a first electrode T41 of the first light-emitting control transistor T4 is connected to the first power supply line PL1, and a second electrode T42 of the first light-emitting control transistor T4 is connected to the first electrode T11 of the driving transistor T1. A gate electrode T50 of the second light-emitting control transistor T5 is connected to the light-emitting control signal line EML, a first electrode T51 of the second light-emitting control transistor T5 is connected to the second electrode T12 of the driving transistor T1, and a second electrode T52 of the second light-emitting control transistors T5 is connected to a first electrode E1 of the light-emitting element 100b.

As illustrated in FIG. 10A, the first reset transistor T6 is connected to the gate electrode T10 of the driving transistor T1 and is configured to reset the gate electrode of the driving transistor T1, and the second reset transistor T7 is connected to the first electrode E1 of the light-emitting element 100b and is configured to reset the first electrode E1 of the light-emitting element 100b. The first initialization signal line INT1 is connected to the gate electrode of the driving transistor T1 through the first reset transistor T6. The second initialization signal line INT2 is connected to the first electrode E1 of the light-emitting element 100b through the second reset transistor T7. For example, the first initialization signal line INT1 and the second initialization signal line INT2 are connected to each other and are input with the same initialization signal, but it is not limited to this. In some embodiments, the first initialization signal line INT1 and the second initialization signal line INT2 may also be insulated from each other and configured to input signals respectively.

For example, as illustrated in FIG. 10A, a first electrode T61 of the first reset transistor T6 is connected to the first initialization signal line INT1, a second electrode T62 of the first reset transistor T6 is connected to the gate electrode T10 of the driving transistor T1, a first electrode T71 of the second reset transistor T7 is connected to the second initialization signal line INT2, and a second electrode T72 of the second reset transistor T7 is connected to the first electrode E1 of the light-emitting element 100b. For example, as illustrated in FIG. 10A, a gate electrode T60 of the first reset transistor T6 is connected to the first reset control signal line RST1, and a gate electrode T70 of the second reset transistor T7 is connected to the second reset control signal line RST2.

As illustrated in FIG. 10A, the first power supply line PL1 is configured to provide the first voltage signal VDD to the pixel circuit 100a. The pixel circuit further includes the storage capacitor Cst, a first electrode Ca of the storage capacitor Cst is connected to the gate electrode T10 of the driving transistor T1, and a second electrode Cb of the storage capacitor Cst is connected to the first power supply line PL1.

For example, as illustrated in FIG. 10A, the display panel further includes the second power supply line PL2, and the second power supply line PL2 is connected to a second electrode 201 of the light-emitting element 100b.

FIG. 10A illustrates a first node N1, a second node N2, a third node N3, and a fourth node N4. For example, in some embodiments, referring to FIG. 5C, FIG. 5E, and FIG. 10A, a capacitor is formed between the first node N1 and the conductive line L1, and a capacitor is formed between the conductive line L1 and the fourth node N4, that is, the conductive line L1 is coupled with the first node N1 and the fourth node N4, respectively, resulting in brightness differences and display defects (for example, forming stripes (Mura)), which affects the display quality.

As illustrated in FIG. 10B, the pixel circuit includes the driving transistor T1, and the driving transistor includes the gate electrode T10. Referring to FIG. 10B and FIG. 10C, the second electrode Cb of the storage capacitor Cst has an opening OPN1, and one end of the connecting electrode CE1 is connected to the gate electrode T10 of the driving transistor T1 through the opening OPN1. The connection electrode CE1 may also be referred to as a first gate signal line SL1. As illustrated in FIG. 10B, the first gate signal line SL1 is connected to the gate electrode T10 of the driving transistor T1.

As illustrated in FIG. 10B, the first gate signal line SL1 is connected to the second gate signal line SL2. The gate electrode T10 of the driving transistor T1, the first gate signal line SL1, and the second gate signal line SL2 constitute a gate signal portion PT1. The potentials on the gate signal portion PT1 are the same. Of course, in other embodiments, the second gate signal line SL2 may not be provided, in this case, the gate electrode T10 of the driving transistor T1 and the first gate signal line SL1 constitute the gate signal portion PT1. For example, the second gate signal line SL2 is the second electrode T62 of the first reset transistor T6.

Referring to FIG. 10B and FIG. 10C, in order to stabilize the potentials on the gate signal portion PT1, the display panel provided by the embodiment of the present disclosure provides a shield electrode SE and a constant voltage line L0, and the constant voltage line L0 is configured to provide a constant voltage to the pixel circuit. The shield electrode SE is connected to the constant voltage line L0, so that the voltage on the shield electrode SE is stable and can play a shielding role to prevent the conductive line L1 from affecting the potentials on the gate signal portion PT1. The orthographic projection of the first gate signal line SL1 on the base substrate BS falls within the orthographic projection of the shield electrode SE on the base substrate BS.

Referring to FIG. 10B to FIG. 10D, in order to make the shield electrode play a better shielding effect and increase the shielding amount, the orthographic projection of the first gate signal line SL1 on the base substrate BS completely falls within the orthographic projection of the shield electrode SE on the base substrate BS.

For example, in order to alleviate display defects (mura) and improve the display effect, the distance between a boundary of the orthographic projection of the first gate signal line SL1 on the base substrate BS and a boundary of the orthographic projection of the shield electrode SE on the base substrate BS is greater than or equal to 1.75 μm. Because the area occupied by the pixel unit is limited, the distance of the shield electrode SE beyond the first gate signal line SL1 can be defined. For example, in some embodiments, in order to obtain a better shielding effect, the distance between the boundary of the orthographic projection of the first gate signal line SL1 on the base substrate BS and the boundary of the orthographic projection of the shield electrode SE on the base substrate BS is greater than or equal to 2.33 μm.

As illustrated in FIG. 10B, the display panel further includes a block BK, and the block BK is connected to the first power supply line PL1. The threshold compensation transistor T3 includes a first channel CN1 and a second channel CN2, and the first channel CN1 and the second channel CN2 are connected by a conductive connection portion CP. The orthographic projection of the block BK on the base substrate BS at least partially overlaps with the orthographic projection of the conductive connection portion CP of the threshold compensation transistor T3 on the base substrate BS. As illustrated in FIG. 10B, the block BK of the pixel unit of the adjacent column is used to shield the conductive connection portion CP of the threshold compensation transistor T3 of the pixel unit of the current column.

For example, as illustrated in FIGS. 10B, 6G, and 6H, in the case where the display panel includes the second gate signal line SL2, the second gate signal line SL2 is connected to the first gate signal line SL1, and the orthographic projection of the second gate signal line SL2 on the base substrate BS falls within the orthographic projection of the block BK on the base substrate BS. For further example, the boundary of the orthographic projection of the block BK on the base substrate BS exceeds the boundary of the orthographic projection of the second gate signal line SL2 on the base substrate BS. For example, the boundary of the orthographic projection of the block BK on the base substrate BS exceeds the boundary of the orthographic projection of the second gate signal line SL2 on the base substrate BS by a distance greater than or equal to 1.75 μm. For example, the boundary of the orthographic projection of the block BK on the base substrate BS exceeds the boundary of the orthographic projection of the second gate signal line SL2 on the base substrate BS by a distance greater than or equal to 2.33 μm. Of course, in other embodiments, the shield electrode SE can also be used to replace the role of the block BK, or the orthographic projection of the second gate signal line SL2 on the base substrate BS not only falls within the orthographic projection of the block BK on the base substrate BS, but also falls within the orthographic projection of the shield electrode SE on the base substrate BS.

For example, the material of the first gate signal line SL1 is different from the material of the second gate signal line SL2. For example, the material of the first gate signal line SL1 includes a metal, and the material of the second gate signal line SL2 includes a conductive material formed by conducting a semiconductor material.

For example, as illustrated in FIG. 10B and FIG. 10D, in order to save wiring, the first power supply line PL1 serves as the constant voltage line L0. In other embodiments, in order to save wiring, the first initialization signal line INT1 can also be used as the constant voltage line or the second initialization signal line INT2 can also be used as the constant voltage line. Examples of the constant voltage line L0 are not limited to the first power supply line PL1, the first initialization signal line INT1, and the second initialization signal line INT2, and any signal line that provides a constant voltage in the pixel circuit can be used as the constant voltage line L0. The embodiment of the present disclosure takes the first power supply line PL1 as the constant voltage line L0 as an example for description, and in the case where a signal line that provides a constant voltage other than the first power supply line PL1 is used as the constant voltage line L0, the shape of the shield electrode SE may be adjusted so that it is connected to the signal line supplying a constant voltage.

As illustrated in FIG. 10D, the shield electrode SE is connected to the constant voltage line L0 through a via hole H21. For example, the constant voltage line L0 may be located in the third conductive layer LY3, and the via hole H21 may penetrate both the fourth insulating layer ISL4 and the fifth insulating layer ISL5.

Referring to FIG. 10C and FIG. 10E, a buffer layer BL is disposed on the base substrate BS, an isolation layer BR is disposed on the buffer layer BL, an active layer LY0 is disposed on the isolation layer BR, a first insulating layer ISL1 is disposed on the active layer LY0, a first conductive layer LY1 is disposed on the first insulating layer ISL1, a second insulating layer ISL2 is disposed on the first conductive layer LY1, a second conductive layer LY2 is disposed on the second insulating layer ISL2, a third insulating layer ISL3 is disposed on the second conductive layer LY2, and a third conductive layer LY3 is disposed on the third insulating layer ISL3. The third conductive layer LY3 includes a connecting electrode CE01, and the connecting electrode CE01 is connected to the second electrode T52 of the second light-emitting control transistor T5 through a via hole H3 penetrating the first insulating layer ISL1, the second insulating layer ISL2, and the third insulating layer ISL3. A fourth insulating layer ISL4 and a fifth insulating layer ISL5 are disposed on the third conductive layer LY3, and a fourth conductive layer LY4 is disposed on the fourth insulating layer ISL4 and the fifth insulating layer ISL5. The fourth conductive layer LY4 includes a connecting electrode CE02, and the connecting electrode CE02 is connected to the connecting electrode CE01 through a via hole H22 that penetrates the fourth insulating layer ISL4 and the fifth insulating layer ISL5. A sixth insulating layer ISL6 is disposed on the fourth conductive layer LY4, and the light-emitting element 100b (the second light-emitting element 30) is connected to the connection electrode CE02 through a via hole H31 (as illustrated in FIG. 10D and FIG. 10E) penetrating the sixth insulating layer ISL6. The light-emitting element 100b includes a first electrode E1, a second electrode E2, and a light-emitting functional layer FL located between the first electrode E1 and the second electrode E2. For example, the connecting element CE0 includes the connecting electrode CE01 and the connecting electrode CE02.

As illustrated in FIG. 10B, one end of the connecting electrode CE1 is connected to the gate electrode T10 of the driving transistor T1 through a via hole H1, and the other end of the connecting electrode CE1 is connected to the second electrode T62 of the first reset transistor T6 through a via hole H2. One end of the connecting electrode CE2 is connected to the first initialization signal line INT1 through a via hole H4, and the other end of the connecting electrode CE2 is connected to the first electrode T61 of the first reset transistor T6 through a via hole H5. One end of the connecting electrode CE3 is connected to the second initializa-tion signal line INT2 through a via hole H6, and the other end of the connecting electrode CE3 is connected to the first electrode T71 of the second reset transistor T7 through a via hole H7. The first power supply line PL1 is connected to the first electrode T41 of the first light-emitting control transistor T4 through a via hole H8. The first power supply line PL1 is connected to the second electrode Cb of the storage capacitor Cst through a via hole H9. The first power supply line PL1 is connected to the block BK through a via hole Hk. The data line DT is connected to the first electrode T21 of the data writing transistor T2 through a via hole H0.

For example, in the manufacturing process of the display panel, a self-aligned process is adopted, and a semiconductor patterned layer is subject to a conductor process by using the first conductive layer LY1 as a mask. The semiconductor pattern layer can be formed by patterning a semiconductor film. For example, the semiconductor pattern layer is heavily doped by ion implantation, so that the portion of the semiconductor pattern layer that is not covered by the first conductive layer LY1 is conducted, and a source electrode region (the first electrode T11) and a drain electrode region (the second electrode T12) of the driving transistor T1, a source electrode region (the first electrode T21) and a drain electrode region (the second electrode T22) of the data writing transistor T2, a source electrode region (the first electrode T31) and a drain electrode region (the second electrode T32) of the threshold compensation transistor T3, a source electrode region (the first electrode T41) and a drain electrode region (the second electrode T42) of the first light-emitting control transistor T4, a source electrode region (the first electrode T51) and a drain electrode region (the second electrode T52) of the second light-emitting control transistor T5, a source electrode region (the first electrode T61) and a drain electrode region (the second electrode T62) of the first reset transistor T6, and a source electrode region (the first electrode T71) and a drain electrode region (the second electrode T72) of the second reset transistor T7 are formed. The portion of the semiconductor pattern layer covered by the first conductive layer LY1 retains semiconductor characteristics, and can form a channel region of the driving transistor T1, a channel region of the data writing transistor T2, a channel region of the threshold compensation transistor T3, a channel region of the first light-emitting control transistor T4, a channel region of the second light-emitting control transistor T5, a channel region of the first reset transistor T6, and a channel region of the second reset transistor T7. For example, as illustrated in FIG. 10B, the second electrode T72 of the second reset transistor T7 and the second electrode T52 of the second light-emitting control transistor T5 are formed as an integrated structure; the first electrode T51 of the second light-emitting control transistor T5, the second electrode T12 of the driving transistor T1, and the first electrode T31 of the threshold compensation transistor T3 are formed as an integrated structure; the first electrode T11 of the driving transistor T1, the second electrode T22 of the data writing transistor T2, and the second electrode T42 of the first light-emitting control transistor T4 are formed as an integrated structure; and the second electrode T32 of the threshold compensation transistor T3 and the second electrode T62 of the first reset transistor T6 are formed as an integrated structure. In some embodiments, as illustrated in FIG. 10B, the first electrode T71 of the second reset transistor T7 and the first electrode T61 of the first reset transistor T6 may be formed as an integrated structure.

For example, the channel regions of the transistors used in the embodiment of the present disclosure may adopt monocrystalline silicon, polycrystalline silicon (such as low temperature polysilicon), or metal oxide semiconductor materials (such as IGZO, AZO, etc.). In one embodiment, the transistors are all P-type low temperature polysilicon (LTPS) thin film transistors. In another embodiment, the threshold compensation transistor T3 and the first reset transistor T6, that are directly connected to the gate electrode of the driving transistor T1, are metal oxide semiconductor thin film transistors, that is, the channel material of the transistor is a metal oxide semiconductor material (such as IGZO, AZO, etc.). The metal oxide semiconductor thin film transistor has a lower leakage current, which can help reduce the leakage current of the gate electrode of the driving transistor T1.

For example, the transistors adopted in the embodiments of the present disclosure may include various structures, such as a top gate type, a bottom gate type, or a dual-gate structure. In one embodiment, the threshold compensation transistor T3 and the first reset transistor T6, which are directly connected to the gate electrode of the driving transistor T1, are dual-gate thin film transistors, which can help reduce the leakage current of the gate electrode of the driving transistor T1.

For example, as illustrated in FIG. 10E, the display panel further includes a pixel definition layer PDL and a spacer PS. The pixel definition layer PDL has an opening OPN, and the opening OPN is configured to define the light-emitting area (light exit region, effective light-emitting area) of the pixel unit. The spacer PS is configured to support a fine metal mask when forming the light-emitting functional layer FL.

For example, the opening OPN is the light exit region of the pixel unit. The light-emitting functional layer FL is located on the first electrode E1 of the light-emitting element 100b, and the second electrode E2 of the light-emitting element 100b is located on the light-emitting functional layer FL. As illustrated in FIG. 10E, an encapsulation layer CPS is disposed on the light-emitting element 100b. The encapsulation layer CPS includes a first encapsulation layer CPS1, a second encapsulation layer CPS2, and a third encapsulation layer CPS3. For example, the first encapsulation layer CPS1 and the third encapsulation layer CPS3 are inorganic material layers, and the second encapsulation layer CPS2 is an organic material layer. For example, the first electrode E1 is the anode of the light-emitting element 100b, and the second electrode E2 is the cathode of the light-emitting element 100b, but it is not limited thereto.

For example, as illustrated in FIG. 10B and FIG. 10D, the orthographic projection of the block BK on the base substrate BS partially overlaps with the orthographic projection of the second gate signal line SL2 on the base substrate BS, and the orthographic projection of the shield electrode SE on the base substrate BS partially overlaps with the orthographic projection of the first gate signal line SL1 on the base substrate BS, so that the block BK and the shield electrode SE jointly function as a shield for the gate signal portion PT1. Of course, in other embodiments, the block BK may not be provided, or the orthographic projection of the block BK on the base substrate BS dose not overlap with the orthographic projection of the second gate signal line SL2 on the base substrate BS.

For example, as illustrated in FIG. 10B and FIG. 10D, the block BK on the left extends to a pixel unit on the left side of the pixel unit illustrated in the figure, in order to shield the conductive connection portion CP of the threshold compensation transistor T3, while the block BK on the right is extended from the block BK connected to a pixel unit on the right side of the pixel unit illustrated in the figure.

As illustrated in FIG. 10B and FIG. 10D, the channel of each transistor as well as the first electrode and the second electrode on both sides of the channel are located in the active layer LY0; the first reset control signal line RST1, the gate line GT, the gate electrode T10 of the driving transistor (the first electrode Ca of the storage capacitor Cst), the light-emitting control signal line EML and the second reset control signal line RST2 are located in the first conductive layer LY1; the first initialization signal line INT1, the second electrode Cb of the storage capacitor Cst, and the second initialization signal line INT2 are located in the second conductive layer LY2; the data line DT, the first power supply line PL1, the connecting electrode CE1, the connecting electrode CE2, the connecting electrode CE3, and the connecting electrode CE01 are located in the third conductive layer LY3; and the shield electrode SE is located in the fourth conductive layer LY4.

As illustrated in FIG. 10B and FIG. 10D, the first initialization signal line INT1, the first reset control signal line RST1, the gate line GT, the light-emitting control signal line EML, the second initialization signal line INT2, and the second reset control signal lines RST2 all extend in the first direction X. As illustrated in FIG. 10B and FIG. 10D, the data line DT and the first power supply line PL1 both extend in the second direction Y.

In the embodiments of the present disclosure, an orthographic projection of an element A on the base substrate BS falls within an orthographic projection of an element B on the base substrate BS means that the orthographic projection of the element A on the base substrate BS completely falls into the orthographic projection of the element B on the base substrate BS, that is, the orthographic projection of the element B on the base substrate BS covers the orthographic projection of the element A on the base substrate BS, and the area of the orthographic projection of the element A on the base substrate BS is less than or equal to the area of the orthographic projection of the element B on the base substrate BS.

For example, in some embodiments of the present disclosure, each pixel circuit 100a is provided with any one of the shield electrodes SE described above. That is, both the first pixel circuit 10 of the first pixel unit 101 and the second pixel circuit 20 of the second pixel unit 102 are provided with any one of the shield electrodes SE described above. For example, the first pixel circuit 10 of the first pixel unit 101 includes the shield electrode SE, and the second pixel circuit 20 of the second pixel unit 102 includes the shield electrode SE. Of course, the shield electrode SE may also take other forms.

For example, the transistors in the pixel circuit of the embodiment of the present disclosure are all thin film transistors. For example, the first conductive layer LY1, the second conductive layer LY2, the third conductive layer LY3, and the fourth conductive layer LY4 are all made of metal materials. For example, the first conductive layer LY1 and the second conductive layer LY2 are formed of metal materials such as nickel and aluminum, etc., but are not limited thereto. For example, the third conductive layer LY3 and the fourth conductive layer LY4 are formed of materials such as titanium, aluminum, etc., but are not limited thereto. For example, the third conductive layer LY3 and the fourth conductive layer LY4 are respectively a structure formed by three sub-layers of Ti/AL/Ti, but are not limited thereto. For example, the base substrate may be a glass substrate or a polyimide substrate, but it is not limited to this, and can be selected as required. For example, the buffer layer BL, the isolation layer BR, the first insulating layer ISL1, the second insulating layer ISL2, the third insulating layer ISL3, the fourth insulating layer IS4, the fifth insulating layer ISL5, and the sixth insulating layer ISL6 are all made of insulating materials. The materials of the first electrode E1 and the second electrode E2 of the light-emitting element can be selected as required. In some embodiments, the first electrode E1 may adopt at least one of transparent conductive metal oxide and silver, but it is not limited thereto. For example, the transparent conductive metal oxide includes indium tin oxide (ITO), but is not limited thereto. For example, the first electrode E1 may adopt a structure in which three sub-layers of ITO-Ag-ITO are arranged. In some embodiments, the second electrode E2 may adopt a metal of low work function, for example at least one of magnesium and silver, but is not limited thereto.

For example, referring to the layout diagrams and the cross-sectional views of the embodiment of the present disclosure, the display panel provided by at least one embodiment of the present disclosure can be manufactured by the following method.

(1) Forming a buffer layer BL and an isolation layer BR on the base substrate BS.
(2) Forming a semiconductor film on the isolation layer BR.
(3) Patterning the semiconductor film to form a semiconductor pattern layer.
(4) Forming a first insulating film on the semiconductor pattern layer.
(5) Forming a first conductive film on the first insulating film, and patterning the first conductive film to form the first conductive layer LY1.
(6) Dopping the semiconductor pattern layer by using the first conductive layer LY1 as a mask, so as to form the active layer LY0.
(7) Forming a second insulating film on the first conductive layer LY1.
(8) Forming a second conductive film on the second insulating layer ISL2, and patterning the second conductive film to form the second conductive layer LY2.
(9) Forming a third insulating film on the second conductive layer LY2.
(10) Patterning at least one of the first insulating film, the second insulating film, and the third insulating film to simultaneously form via holes, the first insulating layer ISL1, the second insulating layer ISL2, and the third insulating layer ISL3.
(11) Forming a third conductive film, patterning the third conductive film to form the third conductive layer LY3, and the components in the third conductive layer LY3 being connected to the components located under the third conductive layer LY3 through the via holes.
(12) Forming a fourth insulating film and a fifth insulating film, and patterning the fourth insulating film and the fifth insulating film to simultaneously form via holes, the fourth insulating layer and the fifth insulating layer.
(13) Forming a fourth conductive film, and patterning the fourth conductive film to form the fourth conductive layer LY4.
(14) Forming at least one insulating layer and at least one transparent conductive layer, and the transparent conductive layer including the conductive lines L1.
(15) Forming a first electrode E1 of the light-emitting element.
(16) Forming a pixel definition layer and a spacer.
(17) Forming a light-emitting functional layer.
(18) Forming a second electrode E2 of the light-emitting element.
(19) Forming an encapsulation layer CPS.

For example, referring to FIG. 2 and FIG. 3, the base substrate BS has a first display region R1 and a second display region R2, the first display region R1 is located on at least one side of the second display region R2, and the pixel unit includes a first pixel unit and a second pixel unit, both the pixel circuit and the light-emitting element of the first pixel unit are located in the first display region R1, the pixel circuit of the second pixel unit is located in the first display region R1, the light-emitting element of the second pixel unit is located in the second display region, the pixel circuit of the second pixel unit is connected to the light-emitting element of the second pixel unit through a conductive line L1.

Figure 11:
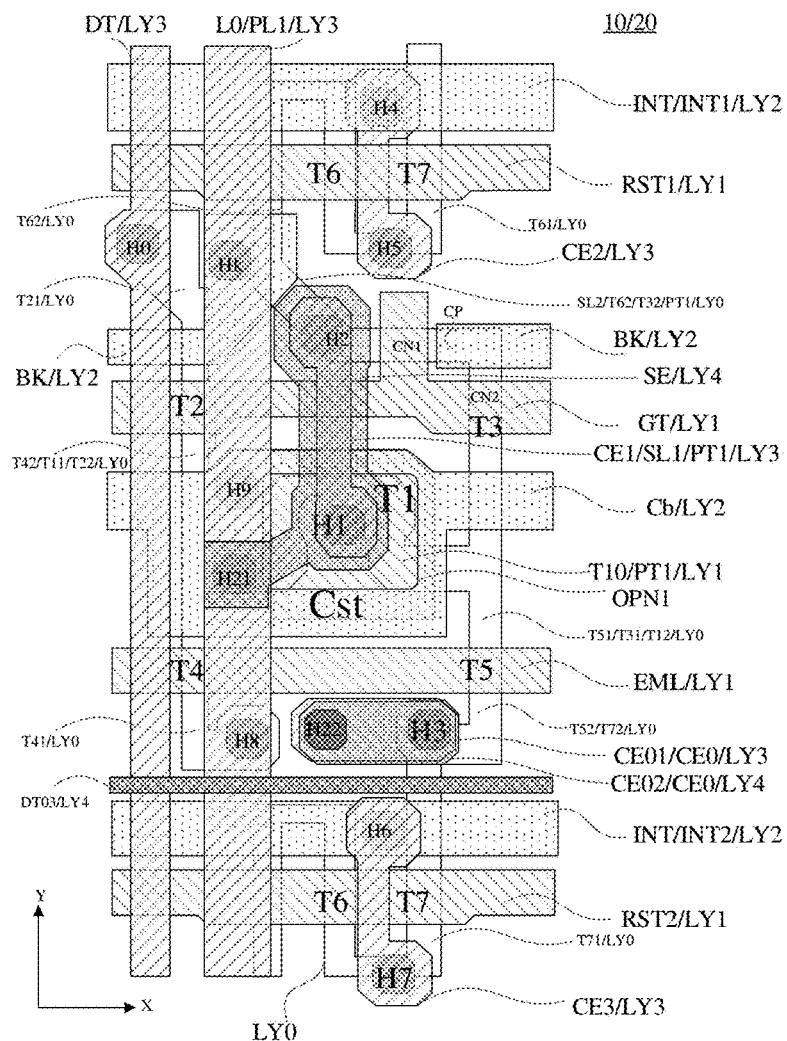
FIG. 11 is a schematic diagram of a display panel provided by an embodiment of the present disclosure.
Figure 12A:
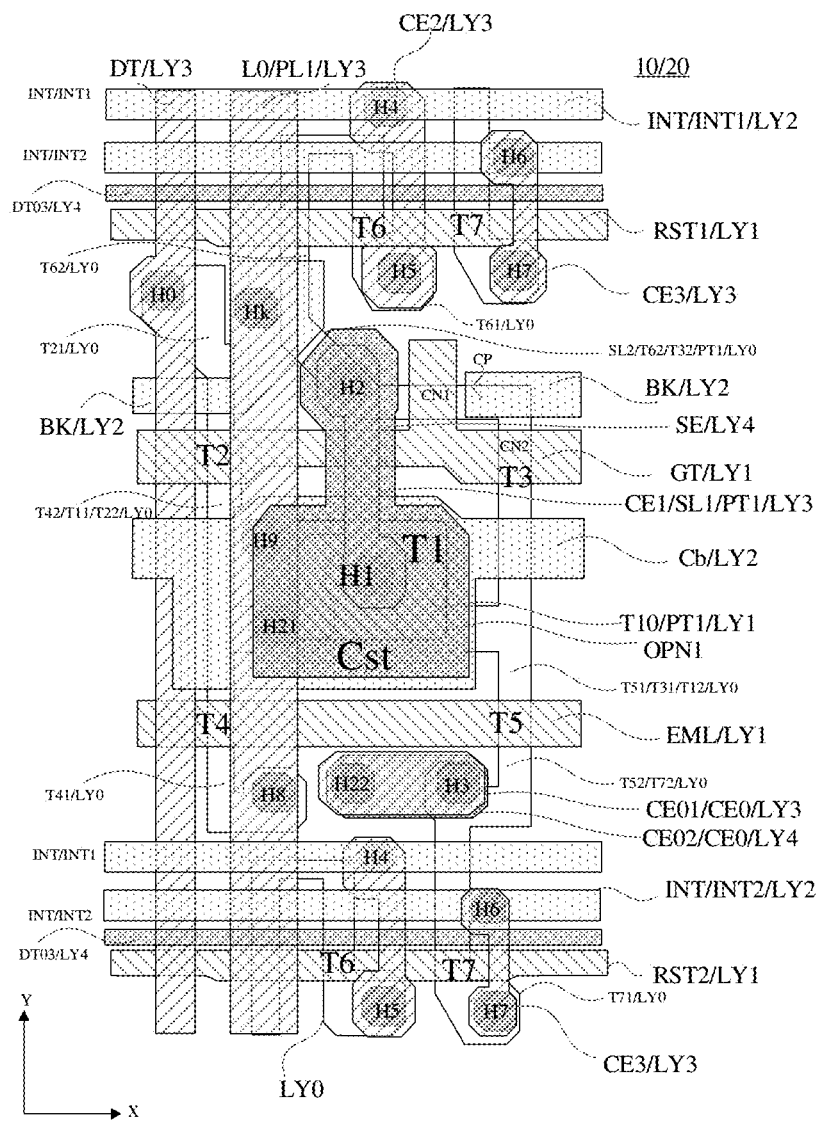
FIG. 12A to FIG. 12C is a schematic diagram of a display panel provided by another embodiment of the present disclosure.
Figure 12B:
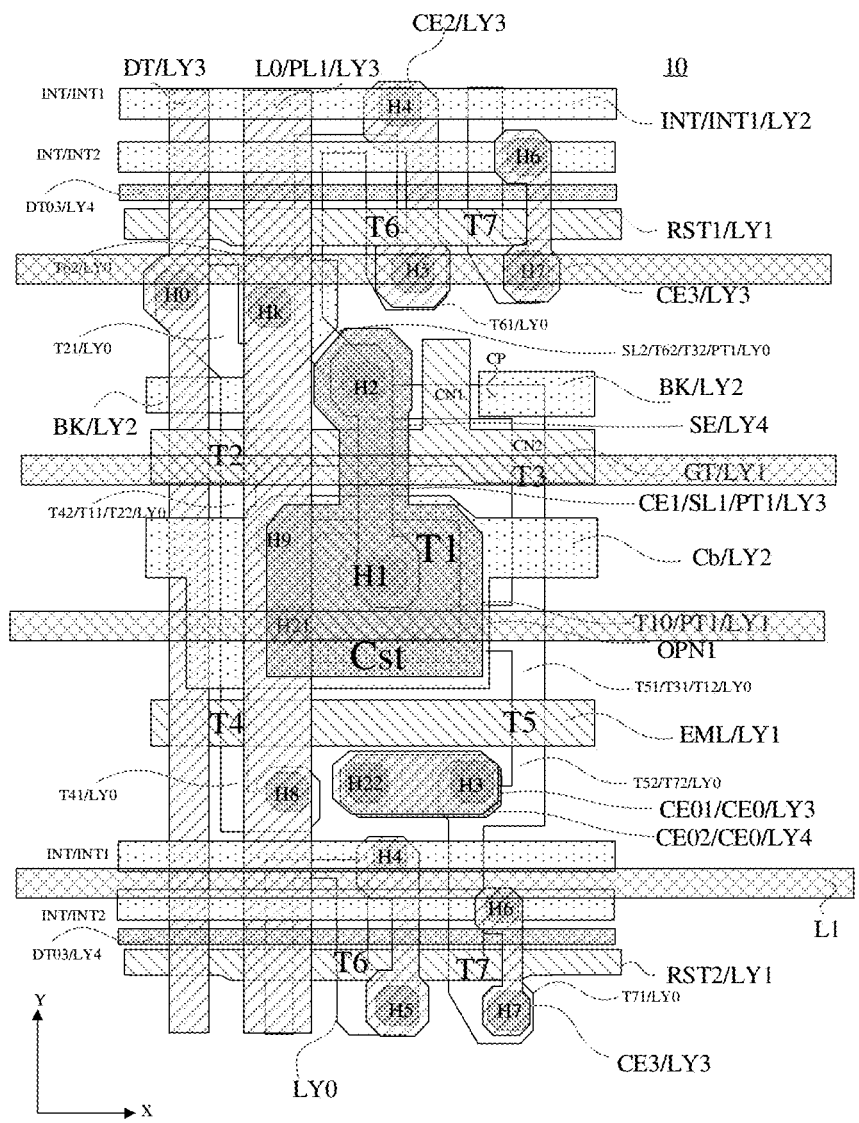
Figure 12C:
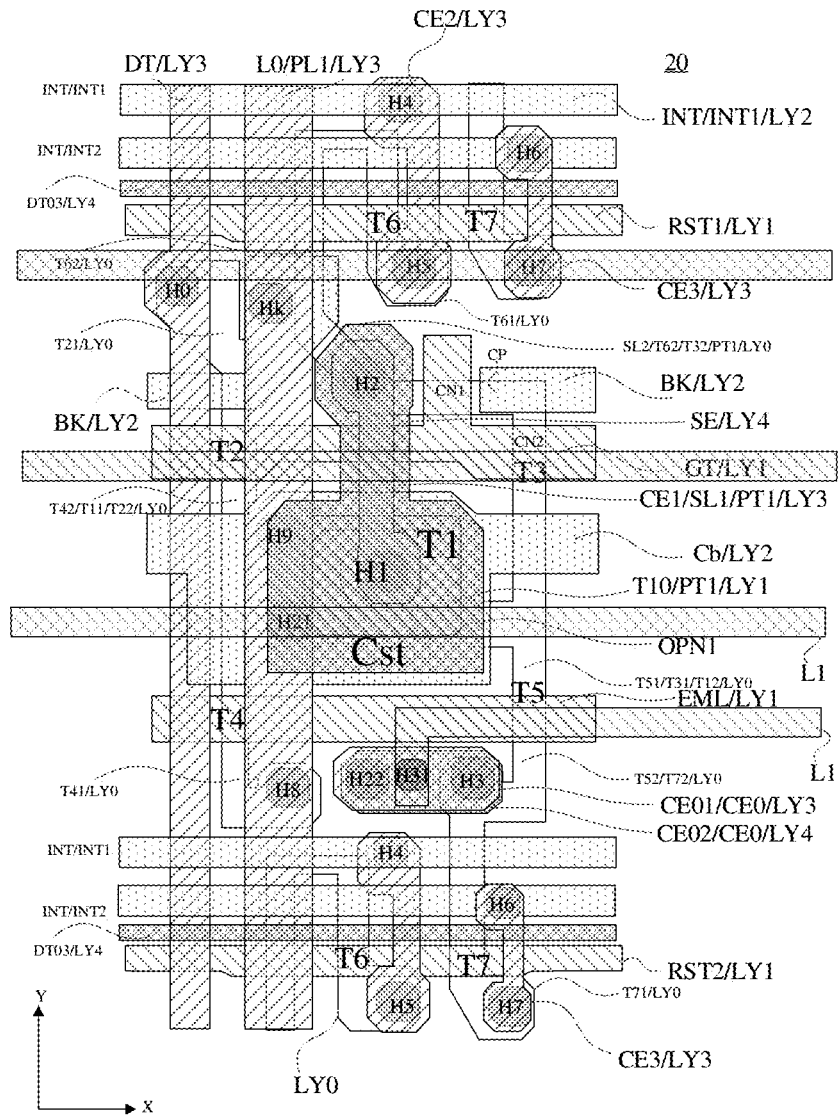
Figure 13:
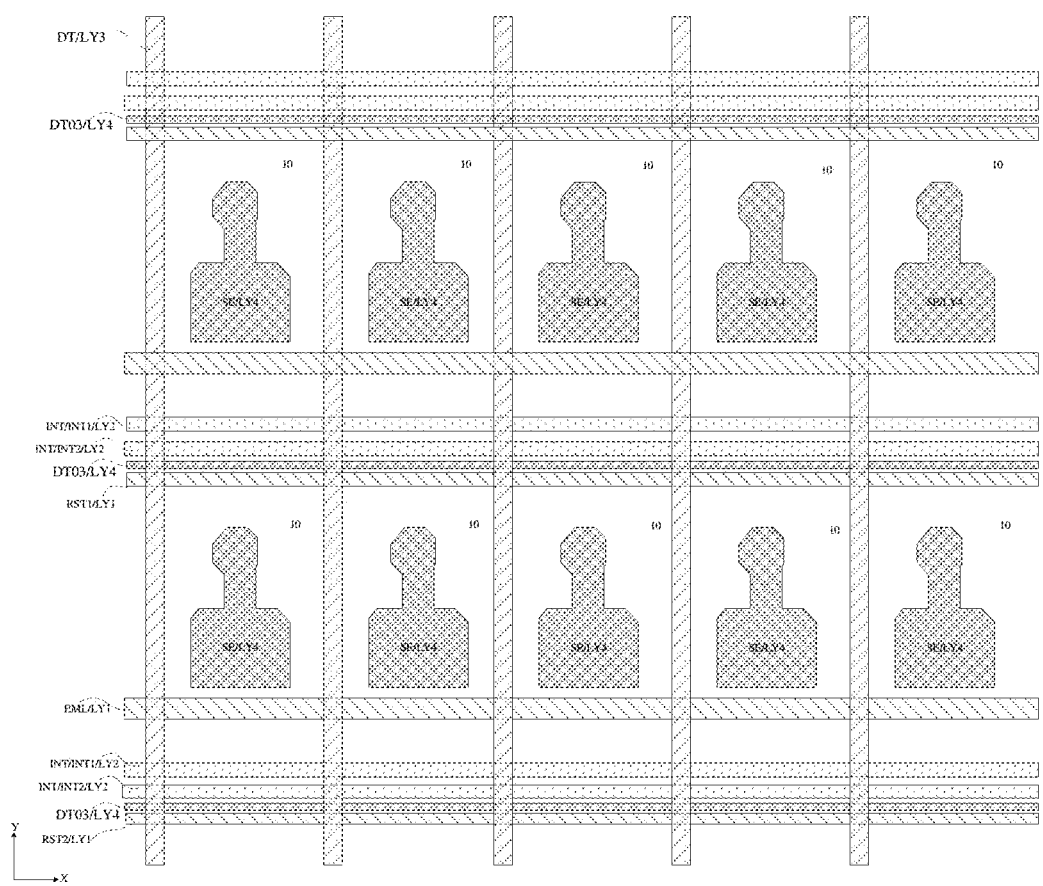
FIG. 13 is a schematic diagram of a display panel provided by another embodiment of the present disclosure.

FIG. 11 is a schematic diagram of a display panel provided by an embodiment of the present disclosure. FIG. 12A to FIG. 12C is a schematic diagram of a display panel provided by another embodiment of the present disclosure. FIG. 13 is a schematic diagram of a display panel provided by another embodiment of the present disclosure. FIG. 14A to FIG. 14H are schematic diagrams of a display panel provided by another embodiment of the present disclosure.

As illustrated in FIG. 11, the third portion DT03 of the second-type data line is located in the fourth conductive layer LY4. Some of the first pixel circuits 10 and/or some of the second pixel circuits 20 in the display panel provided by some embodiments of the present disclosure are illustrated in FIG. 11. The display panel illustrated in FIG. 11 may not be provided with the shield electrode SE.

Compared with the display panel illustrated in FIG. 11, in the display panel illustrated in FIG. 12A, a shape of the shield electrode SE is adjusted. For example, as illustrated in FIG. 12B, in order to better stabilize the potentials on a gate signal portion PT1, the orthographic projection of the gate electrode T10 of the driving transistor T1 on the base substrate BS falls within the orthographic projection of the shield electrode SE on the base substrate BS. The shield electrode SE can be arranged in different shapes as required.

Compared with the display panel illustrated in FIG. 11, the display panel illustrated in FIG. 12A is provided with a first initialization signal line INT1 and a second initialization signal line INT2 which are not connected, so as to be configured to apply signals, respectively. FIG. 10B, FIG. 10D, and FIG. 11 are described with reference to the case where the first initialization signal line INT1 of the pixel circuit of a previous row is the second initialization signal line INT2 of the pixel circuit of the next row, and the first initialization signal line INT1 and the second initialization signal line INT2 are input with the same initialization signal, by way of example. The setting manner of the initialization signal line can be adjusted as required.

For example, in the embodiment of the present disclosure, the third portion DT03 is disposed in the fourth conductive layer LY4 instead of the second conductive layer LY2, which facilitates the disposing of the first initialization signal line INT1 and the second initialization signal line INT2 in the second conductive layer LY2 illustrated in FIG. 12A. That is, it is advantageous to provide the first initialization signal line INT1 and the second initialization signal line INT2 between a light-emitting control signal line EML and a second reset control signal line RST2.

FIG. 12B illustrates a first pixel unit 10, and a plurality of conductive lines L1 pass through the first pixel unit 10, that is, the orthographic projection of the plurality of conductive lines L1 on the base substrate partially overlaps with the orthographic portion of the first pixel unit 10 on the base substrate. The number of the conductive lines L1 overlapping with the first pixel unit 10 is not limited to that illustrated in the drawing.

FIG. 12C illustrates a second pixel unit 20, and a conductive line L1 is connected to the second pixel unit 20. As illustrated in FIG. 12C, the conductive line L1 is connected to the second pixel unit 20 through a via hole H31 penetrating an insulating layer. As illustrated in FIG. 12C, at least one conductive line L1 passes through the second pixel unit 20 and is not connected to the second pixel unit 20, that is, the orthographic projection of some conductive lines L1 on the base substrate partially overlaps with the orthographic projection of the second pixel unit 20 on the base substrate. The number of the conductive lines L1 overlapping with the second pixel unit 20 is not limited to that illustrated in the drawing.

As illustrated in FIG. 12A to FIG. 12C, the orthographic projection of the third portion DT03 on the base substrate BS does not overlap with the orthographic projection of the conductive line L1 on the base substrate BS, so as to reduce the overlap between the signal lines and improve the defects caused by the thinning or disconnection of the conductive line L1 caused by the overlapping of the conductive line L1 and the structure in the fourth conductive layer LY4. For example, the size of the pixel circuit may be compressed in the second direction Y, so that there is space for disposing the third portion DT03 that does not overlap with the conductive line L1, but it is not limited thereto. In the display panel provided by the embodiments of the present disclosure, no limitation is imposed on the size of the pixel circuit in the second direction Y.

For example, as illustrated in FIG. 12B, FIG. 12C and FIG. 5E, the orthographic projection of the conductive line L1 on the base substrate BS partially overlaps with an orthographic projection of the pixel circuit of the first pixel unit on the base substrate BS.

For example, FIG. 10B, FIG. 10D and FIG. 11 are described with reference to the case where the first initialization signal line INT1 and the second initialization signal line INT2 are connected to each other and are input with the same initialization signal. In order to apply signals to the first initialization signal line INT1 and the second initialization signal line INT2, respectively, as illustrated in FIG. 12A to FIG. 12C, two different initialization signal lines may be provided.

For example, as illustrated in FIG. 12A to FIG. 12C, the display panel further includes a first initialization signal line INT1 and a second initialization signal line INT2. Referring to FIG. 10A and FIG. 12A to FIG. 12C, the pixel circuit 100a further includes a first reset transistor T6 and a second reset transistor T7, the first reset transistor T6 is connected to the gate electrode of the driving transistor T1 and is configured to reset the gate electrode of the driving transistor T1, and the second reset transistor T7 is connected to the first electrode E1 of the light-emitting element 100b and is configured to reset the first electrode E1 of the light-emitting element 100b. The first initialization signal line INT1 is connected to the gate electrode of the driving transistor T1 through the first reset transistor T6. The second initialization signal line INT2 is connected to the first electrode E1 of the light-emitting element 100b through the second reset transistor T7. The first initialization signal line INT1 and the second initialization signal line INT2 are not connected to be configured to apply signals, respectively. Adjusting the third portion DT03 to the fourth conductive layer LY4 is advantageous for deposing the initialization signal lines for the first reset transistor T6 and the second reset transistor T7, respectively. That is, the first initialization signal line INT1 and the second initialization signal line INT2 that are not connected are provided.

As illustrated in FIG. 13, the third portion DT03 passes through a plurality of first pixel units 10 in the first direction X. For the sake of clarity, FIG. 13 only illustrates part of the structure.

In FIG. 14A to FIG. 14H, data lines DT are illustrated in the left half of the display panel at a side of the center line a0, and for the sake of clarity, the data lines DT are not illustrated in the right half of the display panel at a side of the center line a0. In FIG. 14A to FIG. 14H, the line extending in the first direction X and overlapping with the via hole indicated by the black dot is the third portion DT03, while the line extending in the first direction X and not overlapping with the via hole indicated by the black dot is the dummy line DMY. The shield electrode is not illustrated in FIG. 14H, and the shield electrode may be located in a rectangular area where the horizontal line intersects with the vertical line. For example, at least one shield electrode can be arranged in a rectangular area. At least one row of pixel units may be arranged between two adjacent horizontal lines in the second direction Y. In FIG. 14A to FIG. 14G, one shield electrode SE may correspond to one pixel circuit. Of course, in a display panel, the shield electrode SE may not be provided. In this case, the shield electrode SE in FIG. 14A to FIG. 14G can be regarded as a pixel circuit.

Figure 14A:
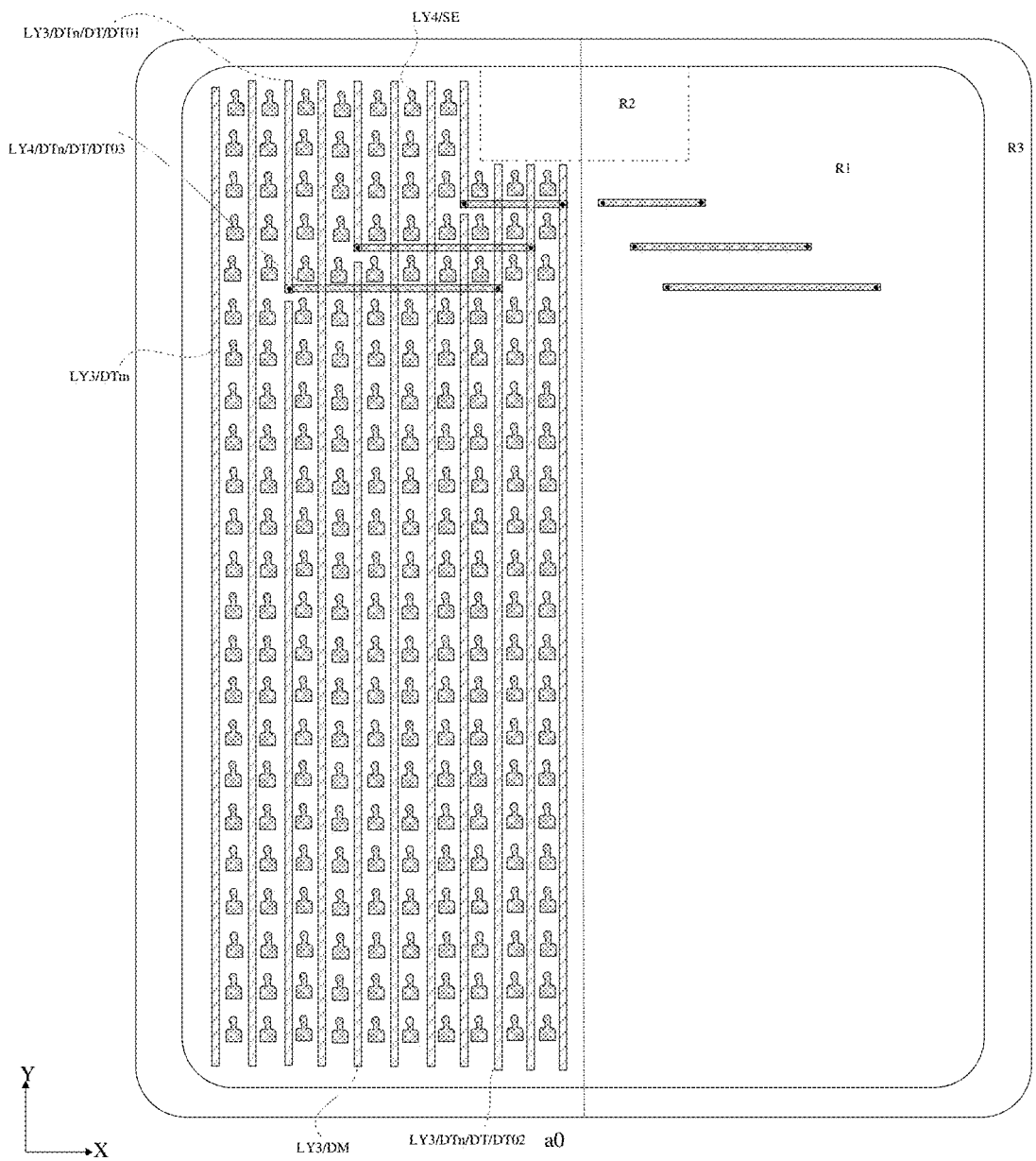
FIG. 14A to FIG. 14H are schematic diagrams of a display panel provided by another embodiment of the present disclosure.

As illustrated in FIG. 14A, the third portion DT03 of the second-type data line DTn is located in the fourth conductive layer LY4 to reduce the load. As illustrated in FIG. 14A, the shield electrode SE and the third portion DT03 of the second-type data line DTn are located in the fourth conductive layer LY4. For the shield electrode SE, reference may be made to the previous description, which will not be repeated here.

Figure 14B:
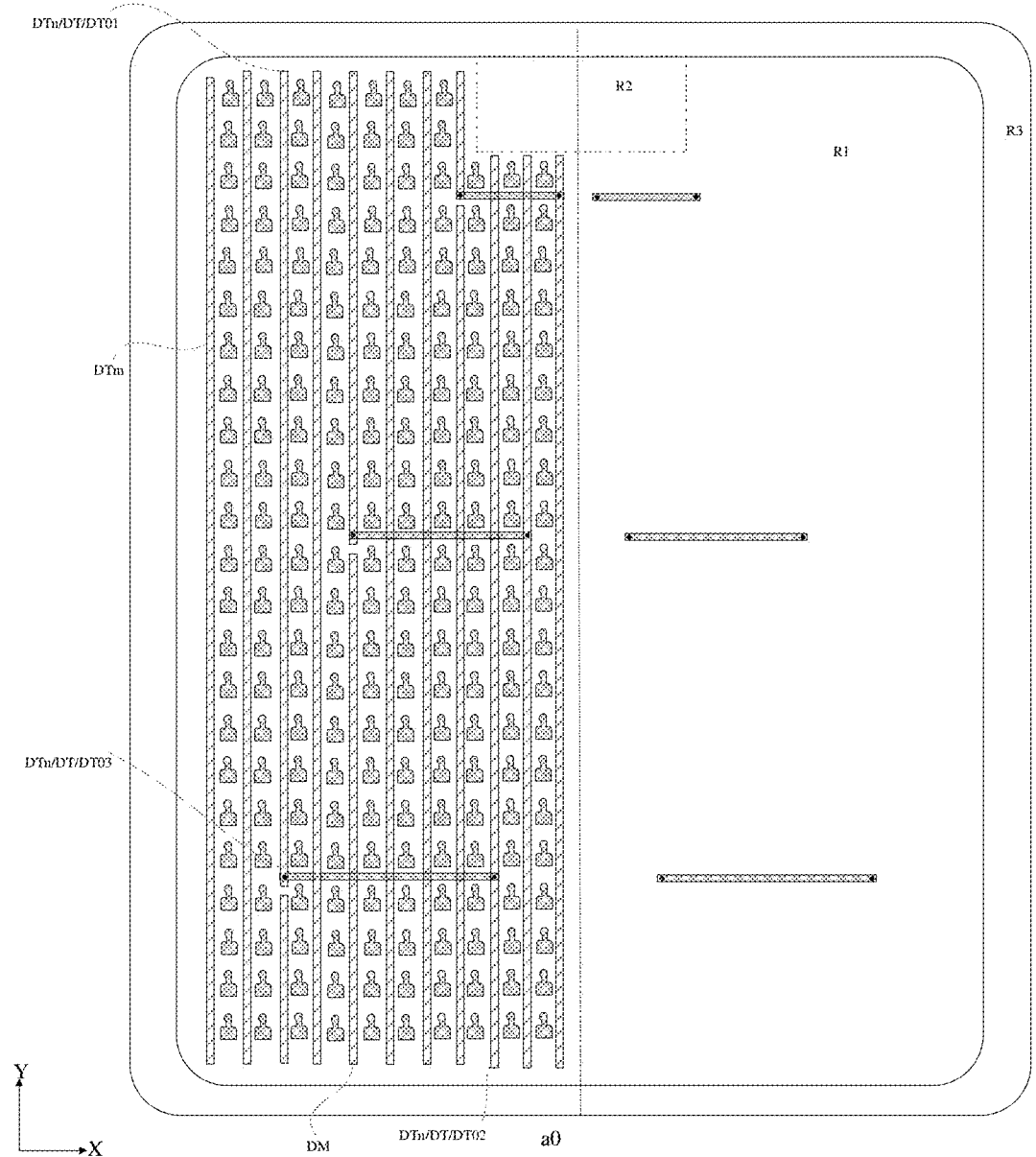

As illustrated in FIG. 14B, a plurality of third portions DT03 are arranged in the display panel in a dispersed manner. A plurality of pixel units or a plurality of rows of pixel units are arranged between adjacent third portions DT03 in the second direction Y. FIG. 14B is illustrated with reference to the case where eight pixel units or eight rows of pixel units are arranged between adjacent third portions DT03 in the second direction Y, by way of example. The number of pixel units arranged between adjacent third portions DT03 in the second direction Y can be arranged as required by those skilled in the art. In FIG. 14B, the third portion DT03 located on the left side of the center line a0 of the display panel and the third portion DT03 located on the right side of the center line a0 of the display panel are symmetrically arranged with respect to the center line a0 of the display panel.

Figure 14C:
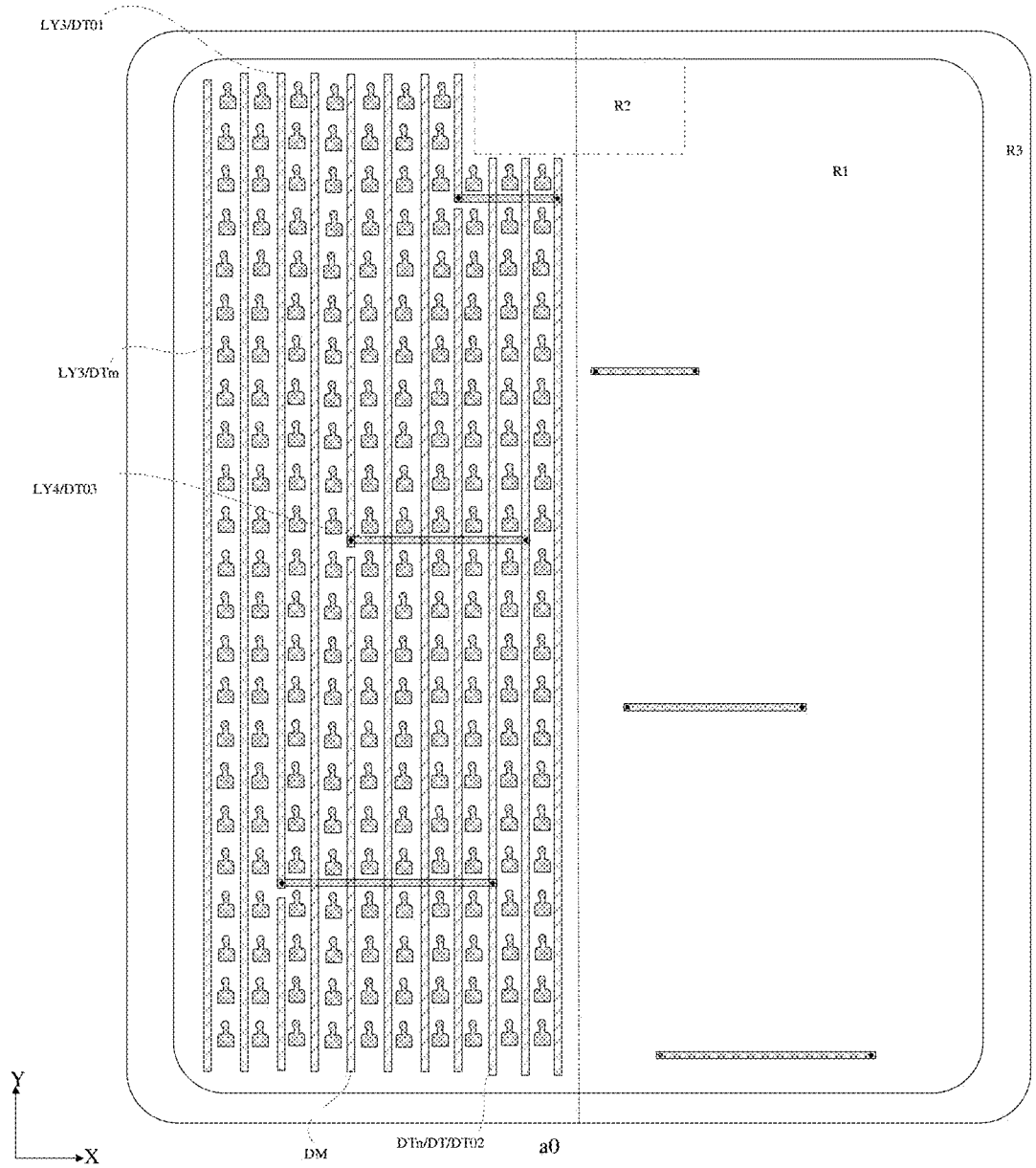

Compared with the display panel illustrated in FIG. 14B, in the display panel illustrated in FIG. 14C, the third portion DT03 located on the left side of the center line a0 of the display panel and the third portion DT03 located on the right side of the center line a0 of the display panel are staggered in the second direction Y.

Figure 14D:
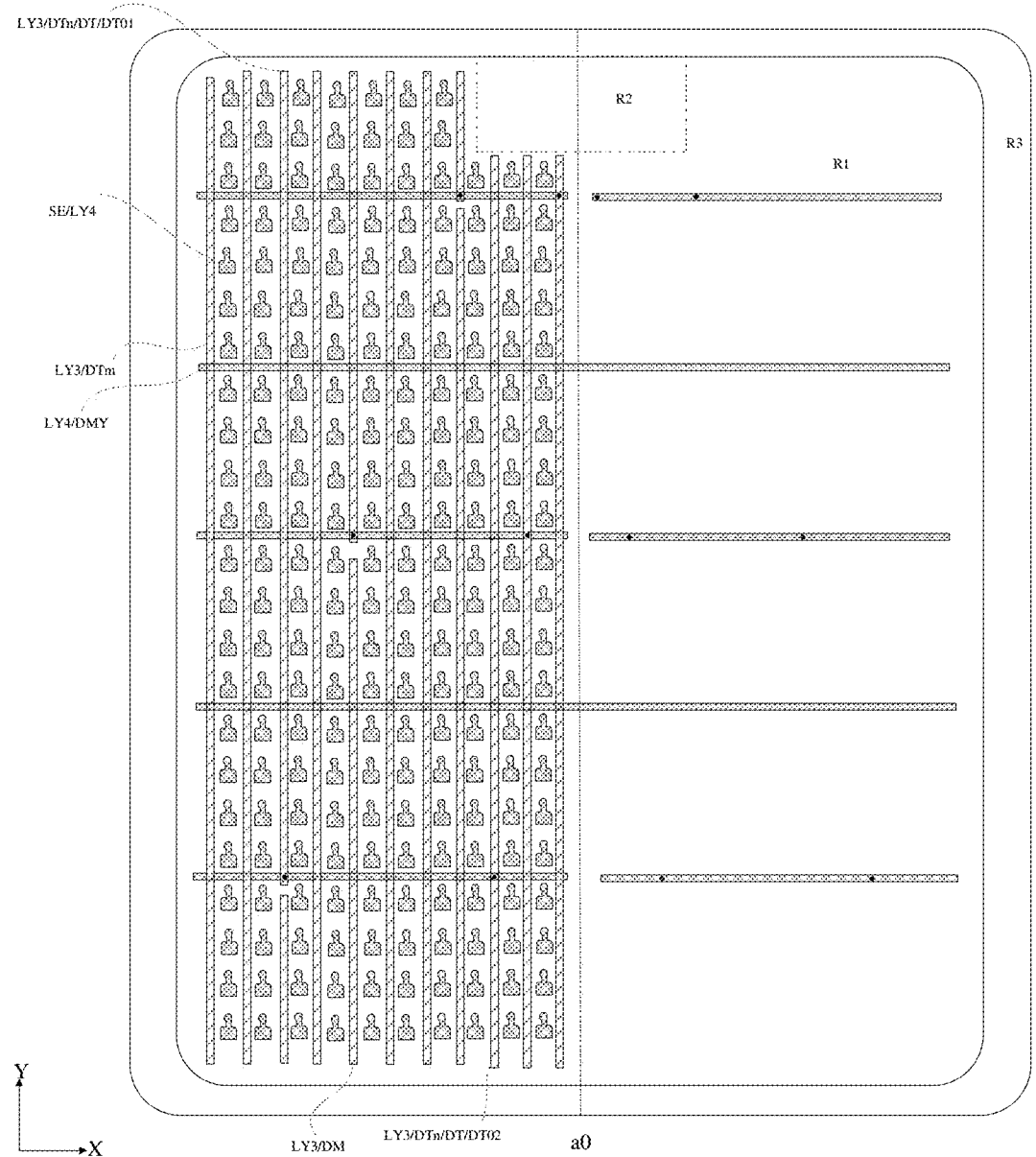

Compared with the display panel illustrated in FIG. 14B, the display panel illustrated in FIG. 14D is provided with a dummy line DMY, and the size of the third portion DT03 in the first direction X is increased.

Figure 14E:
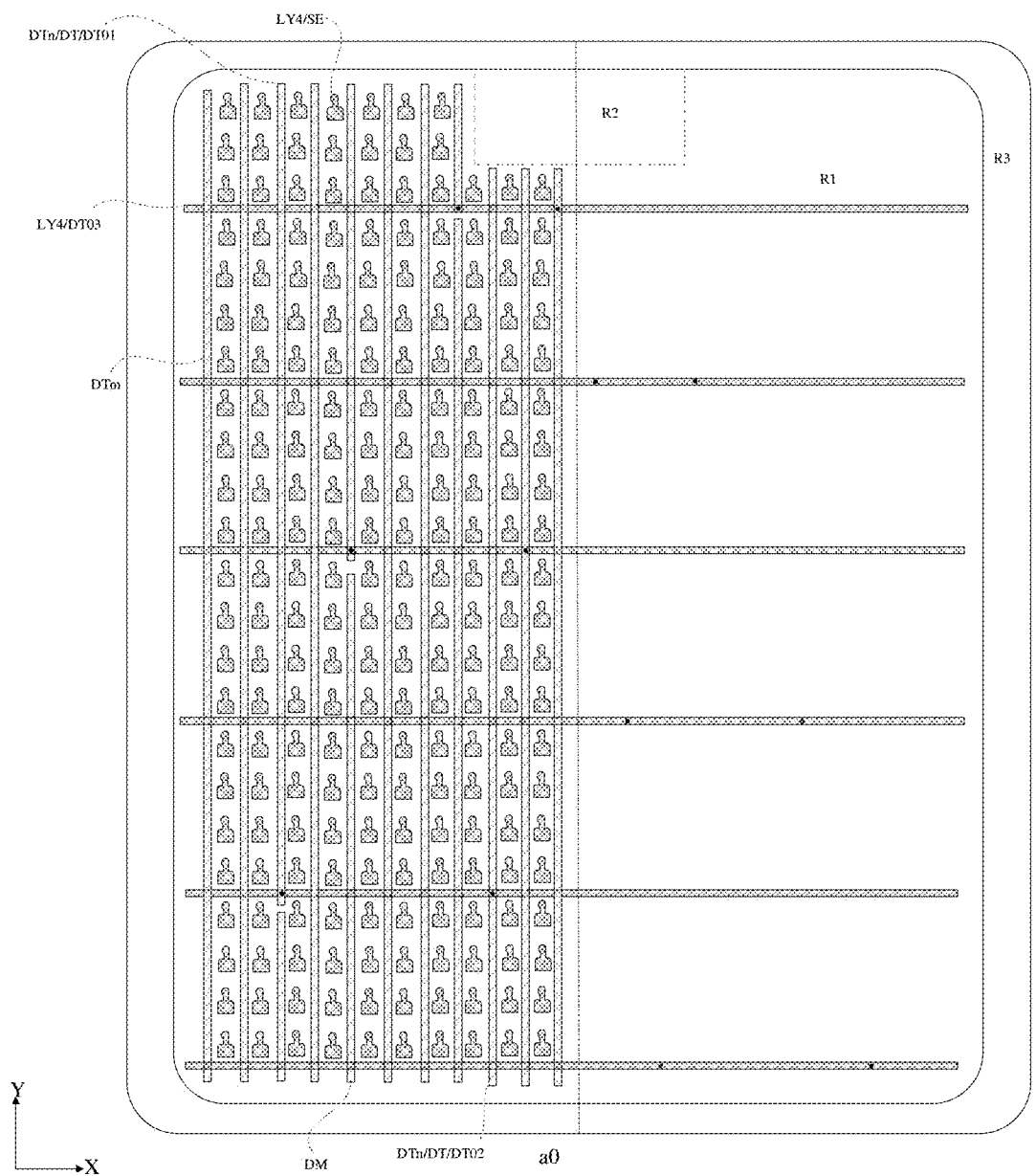

Compared with the display panel illustrated in FIG. 14C, in the display panel illustrated in FIG. 14E, a size of the third portion DT03 in the first direction X is increased.

Figure 14F:
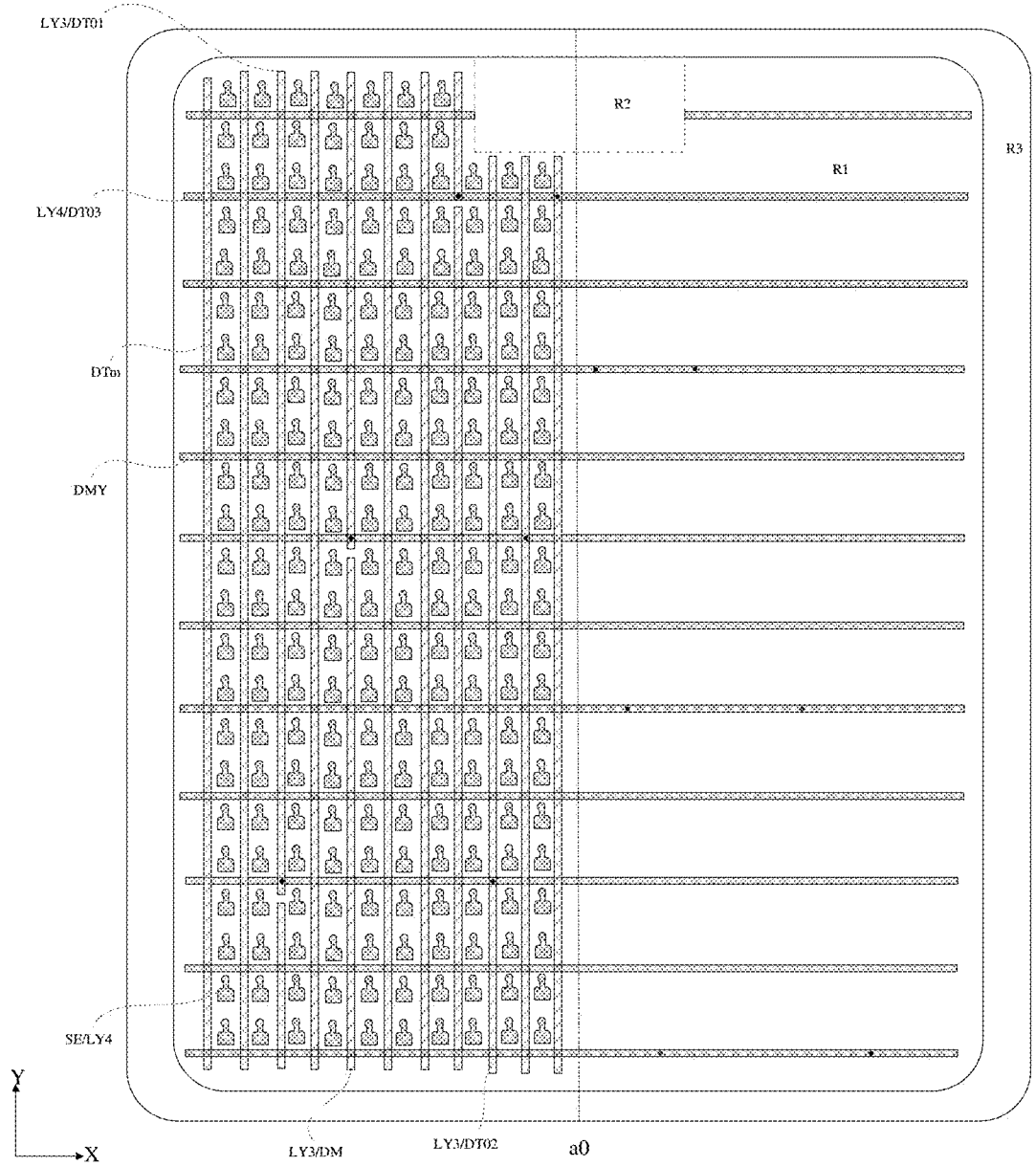

Compared with the display panel illustrated in FIG. 14C, the display panel illustrated in FIG. 14F is provided with a dummy line DMY, and the size of the third portion DT03 in the first direction X is increased.

Figure 14G:
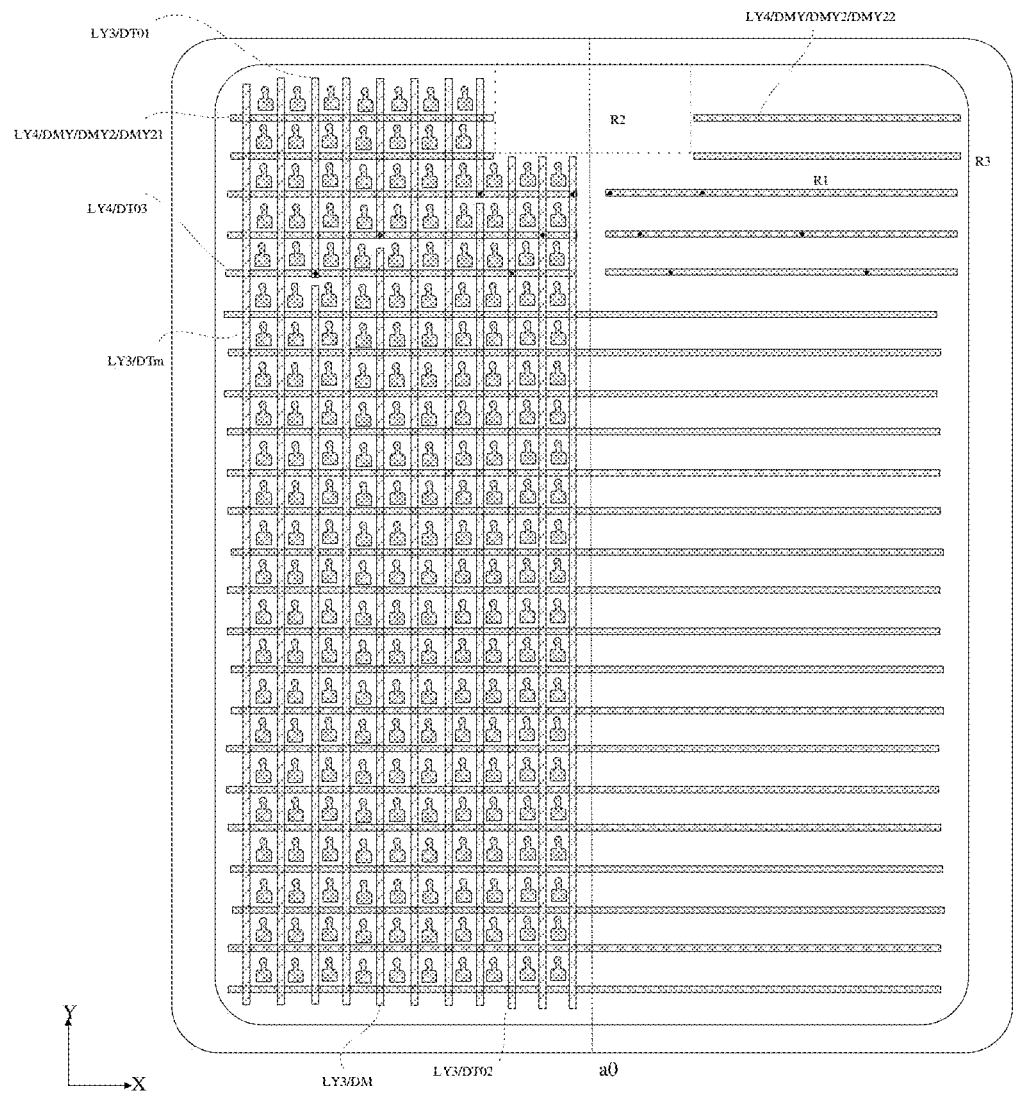

In the display panel illustrated in FIG. 14G and the display panel illustrated in FIG. 14A, a dummy line DMY is provided, and the size of the third portion DT03 in the first direction X is increased.

Figure 14H:
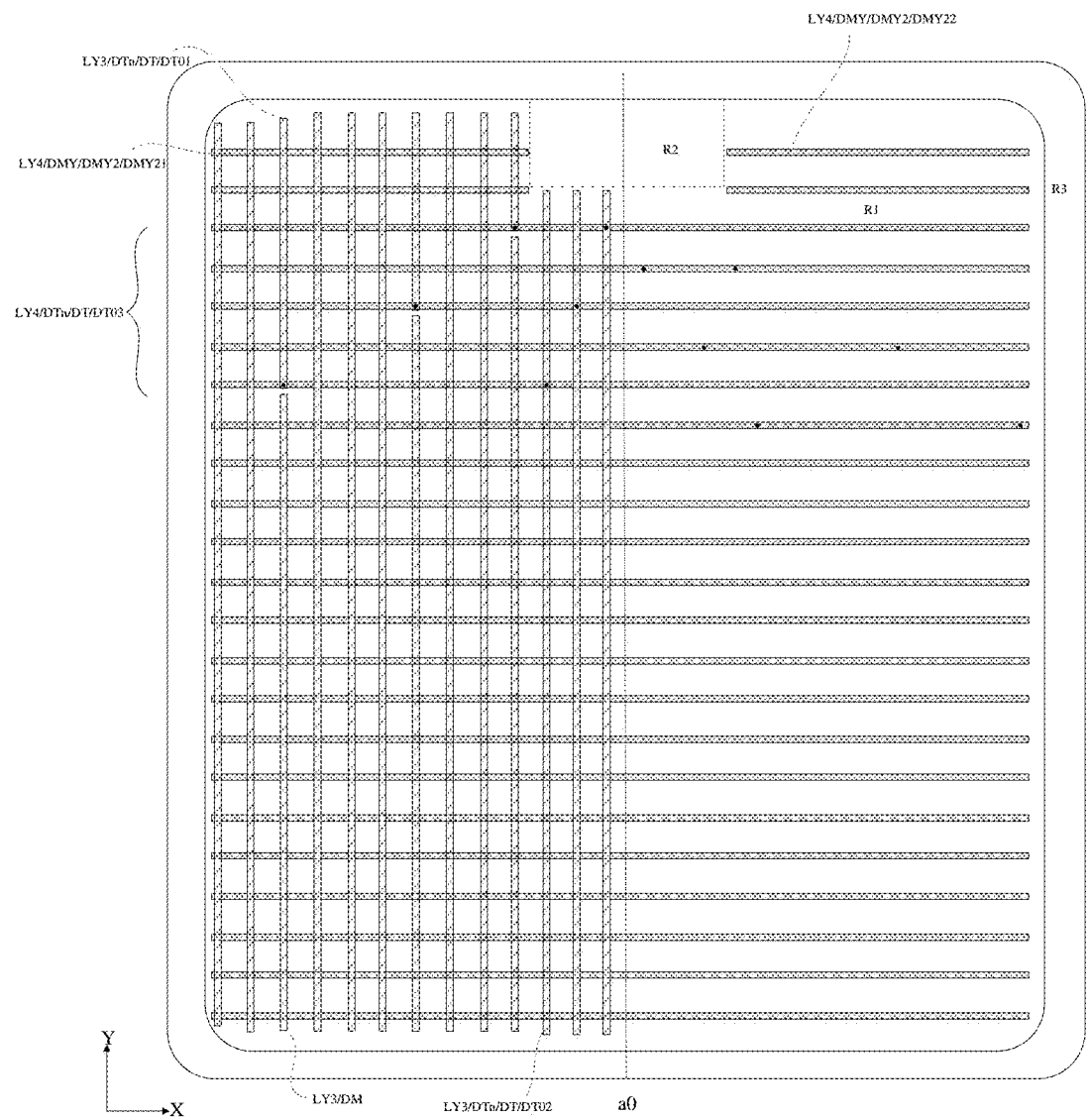

In the display panel illustrated in FIG. 14H and the display panel illustrated in FIG. 14C, a dummy line DMY is provided, and the size of the third portion DT03 in the first direction X is increased.

As illustrated in FIG. 14A to FIG. 14D, and FIG. 14G, the third portion DT03 does not exceed the center line a0. Of course, the embodiment of the present disclosure is not limited to this, as long as the different third portions DT03 are not connected.

As illustrated in FIG. 14E, FIG. 14F, and FIG. 14H, the third portion DT03 exceeds the center line a0 of the display panel.

In other embodiments of the present disclosure, different numbers of pixel units may be arranged between two adjacent third portions DT03 in the second direction Y. No limitation is imposed on the number of pixel units arranged between two adjacent third portions DT03 in the second direction Y in the embodiment of the present disclosure. No limitation is imposed on the number of pixel units arranged between the first portions DT01 of adjacent second-type data lines DTn in the embodiments of the present disclosure.

In the embodiments of the present disclosure, the following situations is taken as an example: for the second-type data lines DTn, the closer the second portion DT02 is to the center line a0, the longer the length of a part of the third portion DT03 between the two via holes used for the third portion DT03 to connect to the first portion DT01 and the second portion DT02, respectively. Those skilled in the art can adjust the connection manner according to needs. For example, in other embodiments, for the second-type data lines DTn, the closer the second portion DT02 is to the center line a0, the shorter of a part of the third portion DT03 between the two via holes used for the third portion DT03 to connect to the first portion DT01 and the second portion DT02, respectively.

At least one embodiment of the present disclosure provides a display device including any one of the above-mentioned display panels.

Figure 15A:
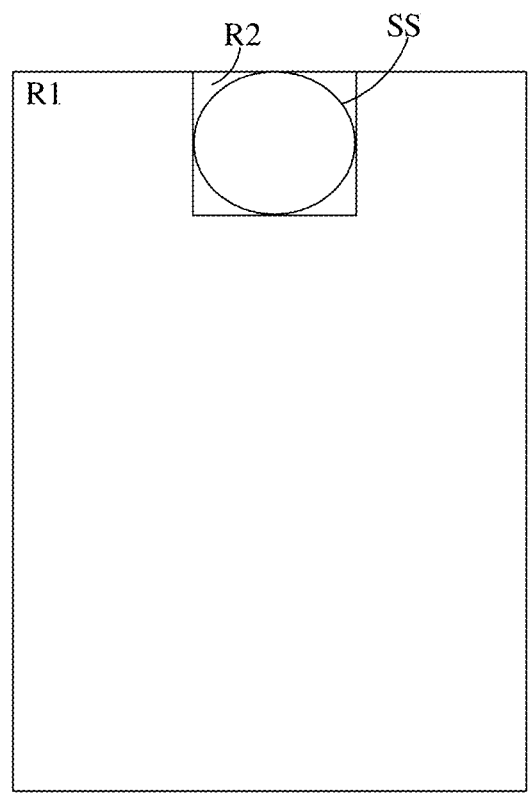
FIG. 15A and FIG. 15B are schematic diagrams of a display device provided by an embodiment of the present disclosure.
Figure 15B:
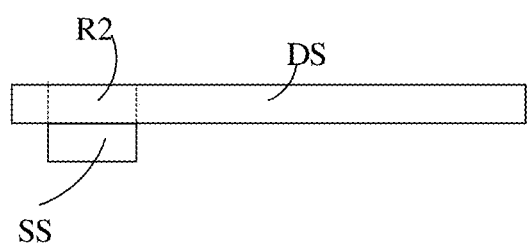

FIG. 15A and FIG. 15B are schematic diagrams of a display device provided by an embodiment of the disclosure. As illustrated in FIG. 15A and FIG. 15B, a photosensitive sensor SS is located on one side of a display panel DS and located in a second display region R2. The ambient light propagates through the second display region R2 and can be sensed by the photosensitive sensor SS. As illustrated in FIG. 15B, the side of the display panel where the photosensitive sensor SS is not provided is a display side, and images can be displayed on the display side.

For example, the display device is a full-screen display device with an under-screen camera. For example, the display device includes products or components with display function that including the above-mentioned display panel, such as a TV, a digital camera, a mobile phone, a watch, a tablet computer, a laptop computer, a navigator, and the like.

Figure 16:
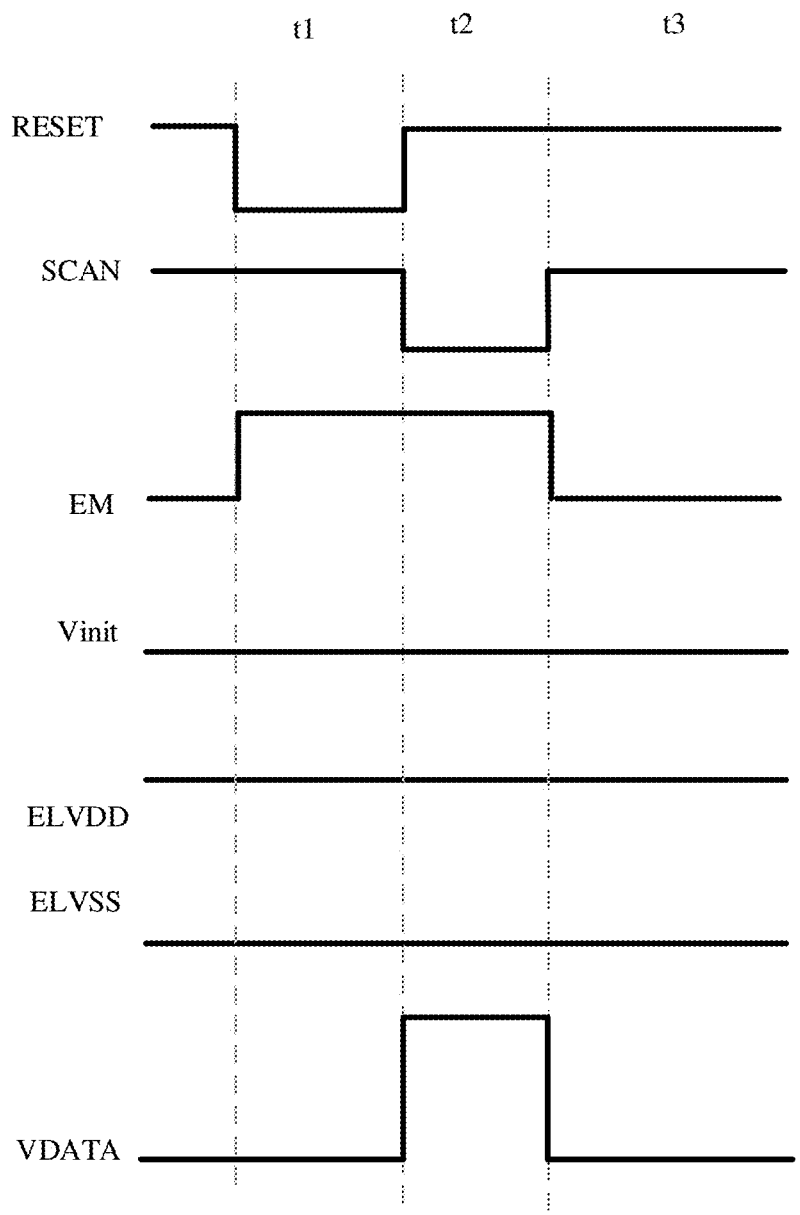
FIG. 16 is a working timing diagram of the pixel circuit illustrated in FIG. 10A.

FIG. 16 is a working timing diagram of the pixel circuit illustrated in IG. 10A. As illustrated in FIG. 16, during one frame of display period, the driving method of the pixel unit includes a first reset stage t1, a data writing, threshold compensation and second reset stage t2, and a light-emitting stage t3. When the reset control signal RESET is at a low level, the gate electrode of the driving transistor T1 is reset, and when the scan signal SCAN is at a low level, the first electrode E1 (for example, the anode) of the light-emitting element 100b is reset. For example, as illustrated in FIG. 10A, when the scan signal SCAN is at a low level, the data voltage VDATA is written, and the threshold voltage Vth of the driving transistor T1 is obtained at the same time, and the data voltage VDADA containing the data information on the data line is stored in the capacitor Cst. When the light-emitting control signal line EML is at a low level, the light-emitting element 100b emits light, and the voltage of the first node N1 (node of the gate electrode) is maintained by the storage capacitor Cst (the light-emitting stability of the light-emitting element 100b). In the driving process of the pixel circuit 10, in the light-emitting stage, the storage capacitor is used to maintain the voltage signal, so that the potential of the signal holding terminal can be kept constant, and a voltage is formed between the gate electrode and the source electrode of the driving transistor, thereby controlling the driving transistor to form a driving current, and then driving the light-emitting element 100b to emit light.

As illustrated in FIG. 16, in the reset stage t1, the light-emitting control signal EM is set to a turn-off voltage, the reset control signal RESET is set to a turn-on voltage, and the scan signal SCAN is set to the turn-off voltage.

As illustrated in FIG. 16, in the data writing, threshold compensation and second reset stage t2, the light-emitting control signal EM is set to the turn-off voltage, the reset control signal RESET is set to the turn-off voltage, and the scan signal SCAN is set to the turn-on voltage.

As illustrated in FIG. 16, in the light-emitting stage t3, the light-emitting control signal EM is set to the turn-on voltage, the reset control signal RESET is set to the turn-off voltage, and the scan signal SCAN is set to the turn-off voltage.

As illustrated in FIG. 16, the first voltage signal ELVDD and the second voltage signal ELVSS are both constant voltage signals. For example, the level of the initialization signal Vinit is between the level of the first voltage signal ELVDD and the level of the second voltage signal ELVSS.

For example, the turn-on voltage in the embodiment of the present disclosure refers to a voltage that can electrically connect the first electrode and the second electrode of the corresponding transistor (the transistor is in ON state), and the turn-off voltage refers to a voltage that can electrically disconnect the first electrode and the second electrode of the corresponding transistor (the transistor is in OFF state). In the case where the transistor is a P-type transistor, the turn-on voltage is a low voltage (for example, 0V), and the turn-off voltage is a high voltage (for example, 5V); and in the case where the transistor is an N-type transistor, the turn-on voltage is a high voltage (for example, 5V) and the turn-off voltage is a low voltage (for example, 0V). The driving waveforms illustrated in FIG. 16 are all explained by taking the P-type transistor as an example. For example, the turn-on voltage is a low voltage (for example, 0V), and the turn-off voltage is a high voltage (for example, 5V), but it is not limited to this.

Please refer to IG. 10A and FIG. 16 together. In the first reset stage t1, the light-emitting control signal EM is of the turn-off voltage, the reset control signal RESET is of the turn-on voltage, and the scan signal SCAN is of the turn-off voltage. At this time, the first reset transistor T6 is in an ON state, and the second reset transistor T7, the data writing transistor T2, the threshold compensation transistor T3, the first light-emitting control transistor T4, and the second light-emitting control transistor T5 are in an OFF state. The first reset transistor T6 transmits the first initialization signal (initialization voltage Vinit) Vinit1 to the gate electrode of the driving transistor T1, and the first initialization signal Vinit1 is stored by the storage capacitor Cst. The driving transistor T1 is reset, and the data stored during the last (previous frame) light-emitting is erased.

In the data writing, threshold compensation, and second reset stage t2, the light-emitting control signal EM is of the turn-off voltage, the reset control signal RESET is of the turn-off voltage, and the scan signal SCAN is of the turn-on voltage. At this time, the data writing transistor T2 and the threshold compensation transistor T3 are in the ON state, the second reset transistor T7 is in the ON state, and the second reset transistor T7 transmits the second initialization signal (initialization voltage Vinit) Vinit2 to the first electrode E1 of the light-emitting element 100b to reset the light-emitting element 100b. The first light-emitting control transistor T4, the second light-emitting control transistor T5, and the first reset transistor T6 are in the OFF state. At this time, the data writing transistor T2 transmits the data voltage VDATA to the first electrode of the driving transistor T1, that is, the data writing transistor T2 receives the scan signal SCAN and the data voltage VDATA and writes the data voltage VDATA to the first electrode of the driving transistor T1 according to the scan signal SCAN. The threshold compensation transistor T3 is turned on to connect the driving transistor T1 into a diode structure, thereby charging the gate electrode of the driving transistor T1. After the charging is completed, the voltage of the gate electrode of the driving transistor T1 is VDATA+Vth, where VDATA is the data voltage and Vth is the threshold voltage of the driving transistor T1, that is, the threshold compensation transistor T3 receives the scan signal SCAN and performs threshold voltage compensation to the gate electrode of the driving transistor T1 according to the scan signal SCAN. During this stage, the voltage difference across the storage capacitor Cst is ELVDD-VDATA-Vth.

In the light-emitting stage t3, the light-emitting control signal EM is of the turn-on voltage, the reset control signal RESET is of the turn-off voltage, and the scan signal SCAN is of the turn-off voltage. The first light-emitting control transistor T4 and the second light-emitting control transistor T5 are in the ON state, while the data writing transistor T2, the threshold compensation transistor T3, the first reset transistor T6 and the second reset transistor T7 are in the OFF state. The first voltage signal ELVDD is transmitted to the first electrode of the driving transistor T1 through the first light-emitting control transistor T4, the voltage of the gate electrode of the driving transistor T1 is maintained at VDATA+Vth, and the light-emitting current I flows into the light-emitting element 100b through the first light-emitting control transistor T4, the driving transistor T1, and the second light-emitting control transistor T5, and then the light-emitting element 100b emits light. That is, the first light-emitting control transistor T4 and the second light-emitting control transistor T5 receive the light-emitting control signal EM, and control the light-emitting element 100b to emit light according to the light-emitting control signal EM. The light-emitting current I satisfies the following saturation current formula:

$$K(Vgs-Vth)^2 = K(VDATA+Vth-ELVDD-Vth)^2 = K(VDATA-ELVDD)^2$$

Among them, $$K = 0.5\mu_n Cox \frac{W}{L},$$

$\mu_n$ is the channel mobility of the driving transistor, Cox is the channel capacitance per unit area of the driving transistor T1, W and L are the channel width and channel length of the driving transistor T1, respectively, and Vgs is the voltage difference between the gate electrode and the source electrode (that is, the first electrode of the driving transistor T1 in this embodiment) of the driving transistor T1.

It can be seen from the above formula that the current flowing through the light-emitting element 100b is independent of the threshold voltage of the driving transistor T1. Therefore, the pixel circuit compensates the threshold voltage of the driving transistor T1 very well.

For example, the ratio of the duration of the light-emitting stage t3 to the display period of one frame can be adjusted. In this way, the luminous brightness can be controlled by adjusting the ratio of the duration of the light-emitting stage t3 to the display period of one frame. For example, by controlling a scan driving circuit in the display panel or an additional driving circuit, the ratio of the duration of the light-emitting stage t3 to the display period of one frame can be adjusted.

For example, the embodiments of the present disclosure are not limited to the specific pixel circuit illustrated in FIG. 10A, and other pixel circuits that can realize compensation for the driving transistor may be adopted. Based on the description and teaching of the implementation manner in the present disclosure, other setting manners that a person of ordinary skill in the art can easily think of without creative work fall within the protection scope of the present disclosure.

The above description takes the 7T1C pixel circuit as an example, and the embodiments of the present disclosure include but are not limited to this. It should be noted that the embodiments of the present disclosure do not limit the number of thin film transistors and the number of capacitors included in the pixel circuit. For example, in some other embodiments, the pixel circuit of the display panel may also be a structure including other numbers of transistors, such as a 7T2C structure, a 6T1C structure, a 6T2C structure, or a 9T2C structure, which is not limited in the embodiments of the present disclosure. Of course, the display panel may also include pixel circuits with less than 7 transistors.

In the embodiments of the present disclosure, the elements located in the same layer can be formed by the same film layer through the same patterning process. For example, the elements located in the same layer may be located on the surface of the same element away from the base substrate.

It should be noted that, for the sake of clarity, in the drawings used to describe the embodiments of the present disclosure, the thickness of a layer or region is exaggerated. It can be understood that when an element such as a layer, film, region, or substrate is referred to as being "on" or "under" another element, the element can be "directly" "on" or "under" the other element, or there may be intermediate elements.

In the embodiments of the present disclosure, the patterning or patterning process may only include a photolithography process, or include a photolithography process and an etching process, or may include other processes for forming predetermined patterns such as printing process and inkjet process. The photolithography process refers to the process including film formation, exposure, development, etc., using photoresist, mask, exposure machine, etc. to form patterns. The corresponding patterning process can be selected according to the structure formed in the embodiment of the present disclosure.

In the case of no conflict, the features in the same embodiment and different embodiments of the present disclosure can be combined with each other.

The above are only specific embodiments of the present disclosure, but the protection scope of the present disclosure is not limited thereto. Any person skilled in the art can easily think of changes or substitutions within the technical scope disclosed in the present disclosure. It should be covered within the protection scope of the present disclosure. Therefore, the protection scope of the present disclosure should be subject to the protection scope of the claims.

What is claimed is:

1. A display panel, comprising:
a base substrate;
a pixel unit, located on the base substrate and comprising a pixel circuit and a light-emitting element, wherein the pixel circuit is configured to drive the light-emitting element, the pixel circuit comprises a driving transistor and a data writing transistor, and the driving transistor is connected to the data writing transistor; and
a data line, connected to the data writing transistor,
wherein the data line comprises a plurality of first-type data lines and a plurality of second-type data lines,
the plurality of first-type data lines are arranged in a first direction, each of the plurality of first-type data lines extends in a second direction, and the first direction intersects with the second direction,
each of the plurality of second-type data lines comprises a first portion, a second portion, and a third portion, and the first portion and the second portion are connected by the third portion,
the first portion and the second portion both extend in the second direction, and the third portion extends in the first direction,
the third portion and the second portion are located in different layers, the third portion and the first portion are located in different layers, the first portion is closer to the base substrate than the third portion, and the second portion is closer to the base substrate than the third portion,
wherein a plurality of third portions are provided, and the plurality of third portions are arranged in the display panel in a dispersed manner, and
a distance between the two farthest third portions is greater than or equal to half of the size of the display panel in the second direction.

2. The display panel according to claim 1, wherein a size of the third portion in the first direction is greater than or equal to a minimum distance between the first portion and the second portion in the first direction.

3. The display panel according to claim 1, further comprising a plurality of dummy lines, wherein the plurality of dummy lines and the third portion of the second-type data line are located in the same layer.

4. The display panel according to claim 3, wherein a plurality of third portions are provided, and the plurality of dummy lines and the plurality of third portions are uniformly arranged in the display panel.

5. The display panel according to claim 3, wherein an extension direction of each of the plurality of dummy lines is the same as an extension direction of the third portion.

6. The display panel according to claim 3, wherein each of the plurality of dummy lines is connected to a constant voltage line,
wherein the data line is connected to the data writing transistor and is configured to provide a data signal to the pixel circuit.

7. The display panel according to claim 6, wherein the constant voltage line comprises at least one selected from the group consisting of a first power supply line, a second power supply line, and an initialization signal line.

8. The display panel according to claim 6, further comprising a plurality of dummy data lines, wherein the plurality of dummy data lines, the first portion of the second-type data line, and the second portion of the second-type data line are all located in the same layer,
each of the plurality of dummy data lines is a disconnected data line, the dummy data line is disconnected from the first portion of the second-type data line, the dummy data line is located between two first-type data lines, and is disconnected from the first portion of a second-type data line between the two first-type data lines.

9. The display panel according to claim 1, further comprising a first initialization signal line and a second initialization signal line, wherein the pixel circuit further comprises a first reset transistor and a second reset transistor, the first reset transistor is connected to a gate electrode of the driving transistor and is configured to reset the gate electrode of the driving transistor, and the second reset transistor is connected to a first electrode of the light-emitting element and is configured to reset the first electrode of the light-emitting element, the first initialization signal line is connected to the gate electrode of the driving transistor through the first reset transistor, and the second initialization signal line is connected to the first electrode of the light-emitting element through the second reset transistor, and the first initialization signal line and the second initialization signal line are not connected to be configured to apply signals, respectively.

10. The display panel according to claim 1, wherein the third portion is located between pixel circuits of two adjacent pixel units in the second direction.

11. The display panel according to claim 1, wherein a distance between two adjacent third portions in the second direction is greater than or equal to a sum of sizes of two pixel units in the second direction.

12. The display panel according to claim 1, wherein the plurality of third portions are uniformly arranged within a maximum size of the display panel in the second direction.

13. The display panel according to claim 1, wherein base substrate has a first display region and a second display region, the first display region is located on at least one side of the second display region, and the pixel unit comprises a first pixel unit and a second pixel unit, the pixel circuit and the light-emitting element of the first pixel unit are located in the first display region, the pixel circuit of the second pixel unit is located in the first display region, the light-emitting element of the second pixel unit is located in the second display region, the pixel circuit of the second pixel unit is connected to the light-emitting element of the second pixel unit through a conductive line, and an orthographic projection of the third portion on the base substrate does not overlap with an orthographic projection of the conductive line on the base substrate.

14. The display panel according to claim 13, wherein the orthographic projection of the conductive line on the base substrate partially overlaps with an orthographic projection of the pixel circuit of the first pixel unit on the base substrate.

15. The display panel according to claim 1, wherein the plurality of first-type data lines and first portions of the plurality of second-type data lines are arranged at intervals.

16. The display panel according to claim 1, wherein each of the second-type plurality of data lines further comprise a fourth portion and a fifth portion, the fourth portion extends in the second direction, the fifth portion extends in the first direction, and the first portion and the fourth portion are connected by the fifth portion.

17. A display device, comprising the display panel according to claim 1.

18. The display device according to claim 17, further comprising a photosensitive sensor, wherein the photosensitive sensor is located on one side of the display panel.

19. The display device according to claim 17, further comprising a sensor, wherein the sensor is located on one side of the display panel.

20. The display panel according to claim 1, wherein the plurality of third portions are uniformly arranged in a display region greater than or equal to half of the size of the display panel in the second direction.

* * * * *